(12) United States Patent
Feng et al.

(10) Patent No.: US 7,868,431 B2
(45) Date of Patent: Jan. 11, 2011

(54) COMPACT POWER SEMICONDUCTOR PACKAGE AND METHOD WITH STACKED INDUCTOR AND INTEGRATED CIRCUIT DIE

(75) Inventors: Tao Feng, Santa Clara, CA (US); Xiaotian Zhang, San Jose, CA (US); François Hébert, San Mateo, CA (US); Ming Sun, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 153 days.

(21) Appl. No.: 12/391,251

(22) Filed: Feb. 23, 2009

(65) Prior Publication Data

US 2009/0160595 A1    Jun. 25, 2009

Related U.S. Application Data

(63) Continuation-in-part of application No. 12/011,489, filed on Jan. 25, 2008, and a continuation-in-part of application No. 11/986,673, filed on Nov. 23, 2007.

(51) Int. Cl.
*H01L 23/495* (2006.01)
*H01L 21/44* (2006.01)
*H01L 21/48* (2006.01)
*H01L 21/50* (2006.01)
*H01F 5/00* (2006.01)

(52) U.S. Cl. .............. 257/673; 438/123; 336/200; 257/E21.51; 257/E23.054

(58) Field of Classification Search ............ 438/123; 336/200; 257/673, E23.054, E21.51
See application file for complete search history.

(56) References Cited

U.S. PATENT DOCUMENTS 3,614,554 A * 10/1971 Shield et al. ............... 257/531

(Continued)

FOREIGN PATENT DOCUMENTS

JP    05198440    8/1993

OTHER PUBLICATIONS

USPTO Office Action for U.S. Appl. No. 12/011,489, mailing date Mar. 19, 2010.

(Continued)

*Primary Examiner*—David S Blum
(74) *Attorney, Agent, or Firm*—Chein-Hwa Tsao; Chemily LLC

(57) ABSTRACT

A power semiconductor package is disclosed with high inductance rating while exhibiting a reduced foot print. It has a bonded stack of power IC die at bottom, a power inductor at top and a circuit substrate, made of leadframe or printed circuit board, in the middle. The power inductor has a inductor core of closed magnetic loop. The circuit substrate has a first number of bottom half-coil forming conductive elements beneath the inductor core. A second number of top half-coil forming conductive elements, made of bond wires, three dimensionally formed interconnection plates or upper leadframe leads, are located atop the inductor core with both ends of each element connected to respective bottom half-coil forming conductive elements to jointly form an inductive coil enclosing the inductor core. A top encapsulant protectively encases the inductor core, the top half-coil forming conductive elements, the bottom half-coil forming conductive elements and the circuit substrate.

28 Claims, 23 Drawing Sheets

U.S. PATENT DOCUMENTS

| | | | |
|---|---|---|---|
| 3,858,138 A | 12/1974 | Gittleman et al. |
| 4,103,267 A | 7/1978 | Olschewski |
| 4,543,553 A | 9/1985 | Mandai et al. |
| 5,032,815 A | 7/1991 | Kobayashi et al. |
| 5,041,903 A | 8/1991 | Millerick et al. |
| 5,070,317 A | 12/1991 | Bhagat |
| 5,425,166 A | 6/1995 | Hastings et al. |
| 5,428,245 A | 6/1995 | Lin et al. |
| 5,469,334 A | 11/1995 | Balakrishnan |
| 5,886,393 A | 3/1999 | Merrill et al. |
| 5,959,846 A | 9/1999 | Noguchi et al. |
| 6,236,538 B1 | 5/2001 | Yamada et al. |
| 6,429,764 B1 | 8/2002 | Karam et al. |
| 6,608,367 B1 | 8/2003 | Gibson et al. |
| 6,621,140 B1 | 9/2003 | Gibson et al. |
| 6,630,881 B1 | 10/2003 | Takeuchi et al. |
| 6,765,284 B2 | 7/2004 | Gibson et al. |
| 6,847,104 B2 | 1/2005 | Huang et al. |
| 6,927,481 B2 | 8/2005 | Gibson et al. |
| 6,930,584 B2 | 8/2005 | Edo et al. |
| 6,998,952 B2 * | 2/2006 | Zhou et al. ................ 336/200 |
| 7,046,114 B2 | 5/2006 | Sakata |
| 7,091,576 B2 | 8/2006 | Yamamoto et al. |
| 7,167,073 B2 | 1/2007 | Hatano |
| 7,196,514 B2 | 3/2007 | Li |
| 7,229,908 B1 | 6/2007 | Drizlikh et al. |
| 7,268,659 B2 | 9/2007 | Nishio et al. |
| 7,368,908 B2 | 5/2008 | Yamada |
| 7,622,796 B2 | 11/2009 | Shi et al. |
| 7,786,837 B2 | 8/2010 | Hebert |
| 2002/0097128 A1 | 7/2002 | Imam |
| 2003/0070282 A1 | 4/2003 | Hiatt et al. |
| 2004/0169266 A1 | 9/2004 | Maxwell |
| 2004/0212475 A1 | 10/2004 | Schumacher |
| 2006/0227518 A1 | 10/2006 | Nishio et al. |
| 2007/0026676 A1 | 2/2007 | Li et al. |
| 2008/0061918 A1 | 3/2008 | Greiff |
| 2008/0094165 A1 | 4/2008 | Orlando et al. |
| 2008/0238599 A1 | 10/2008 | Hebert et al. |
| 2009/0057822 A1 * | 3/2009 | Wen et al. .................. 257/531 |
| 2010/0007456 A1 | 1/2010 | Joehren et al. |

OTHER PUBLICATIONS

USPTO Office Action for U.S. Appl. No. 12/011,489, mailing date Aug. 19, 2010.

USPTO Office Action for U.S. Appl. No. 12/379,473 mailing date Sep. 15, 2010.

* cited by examiner

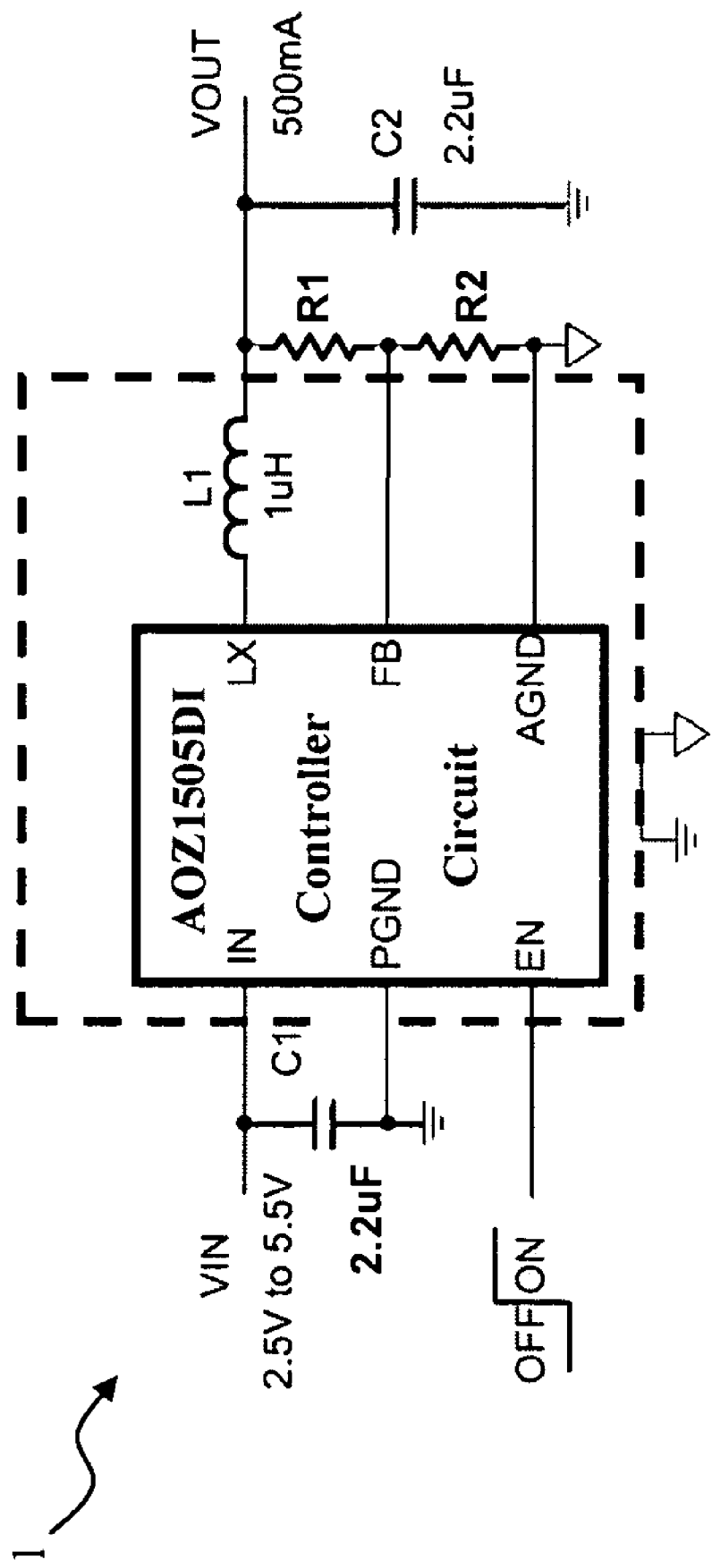
Fig. A

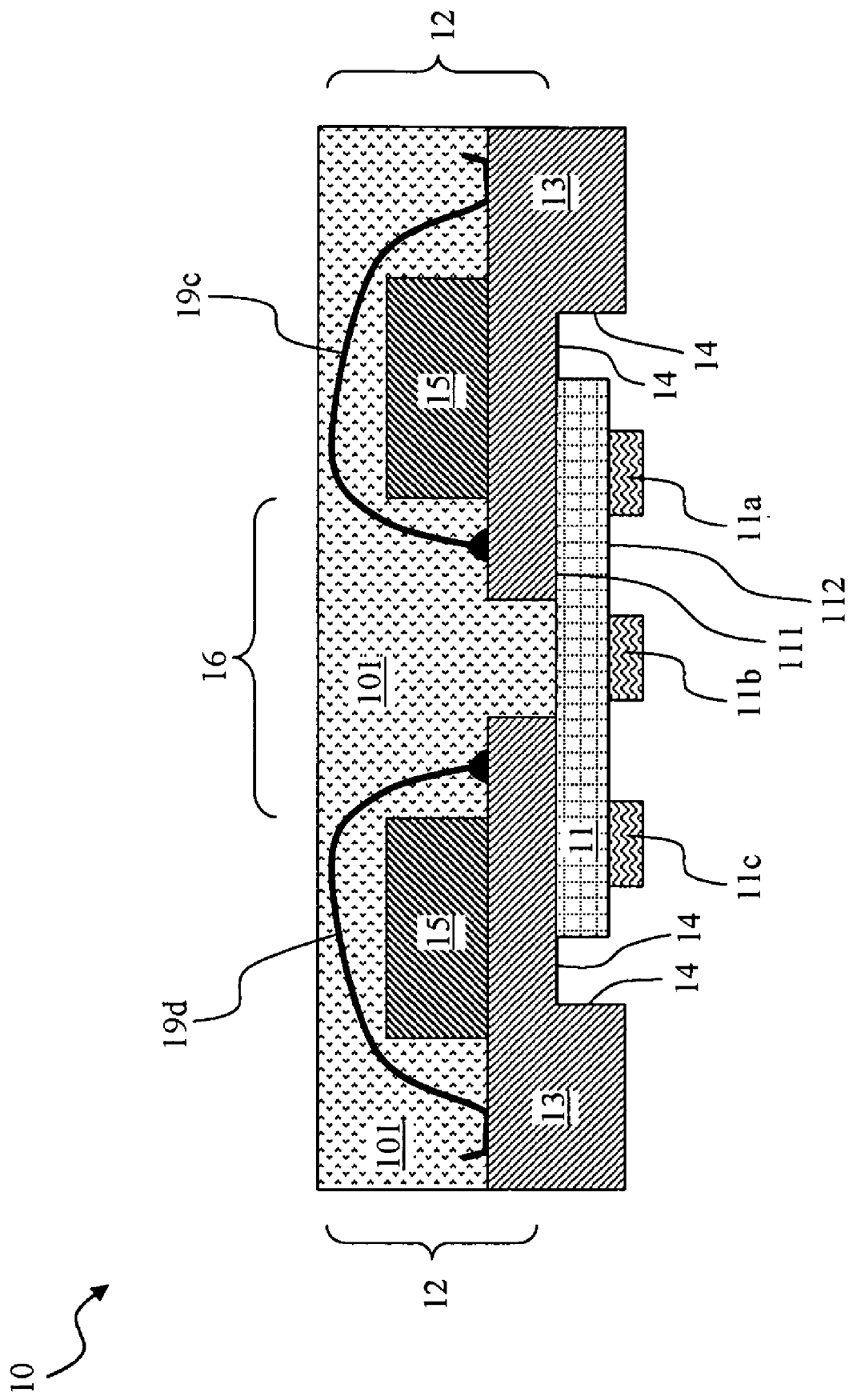
Fig. 1A PRESENT INVENTION

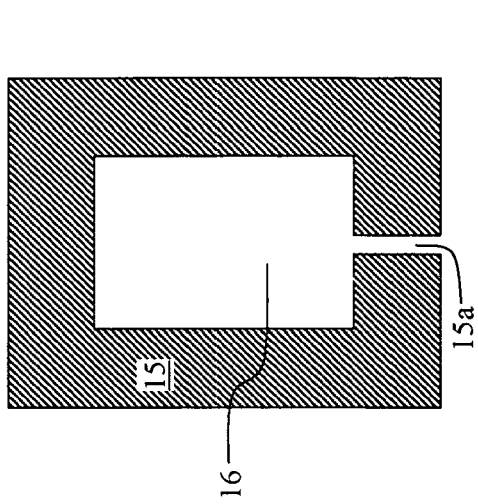
Fig. 1C Present Invention
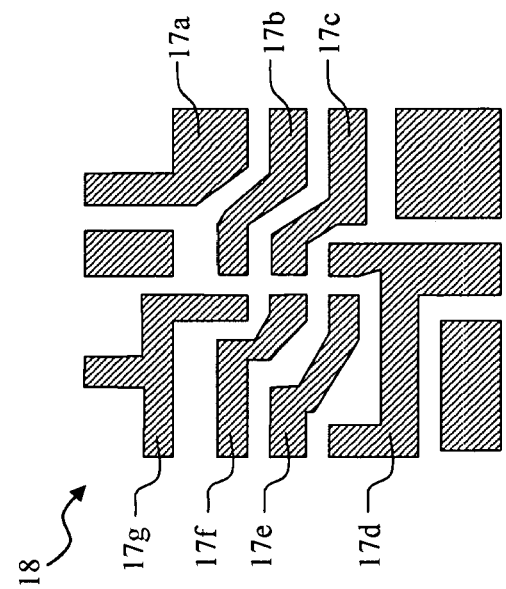
Fig. 1D Present Invention
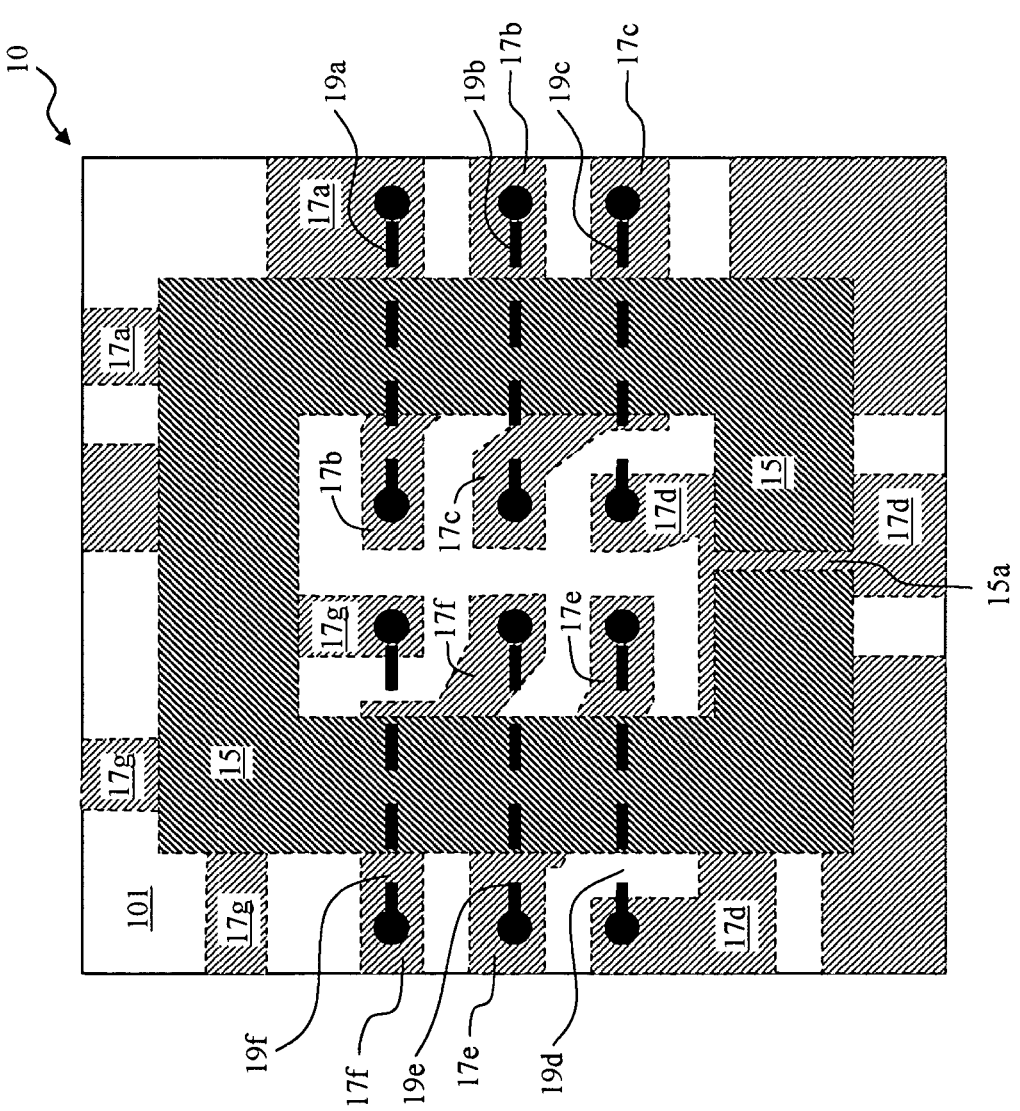
Fig. 1B Present Invention

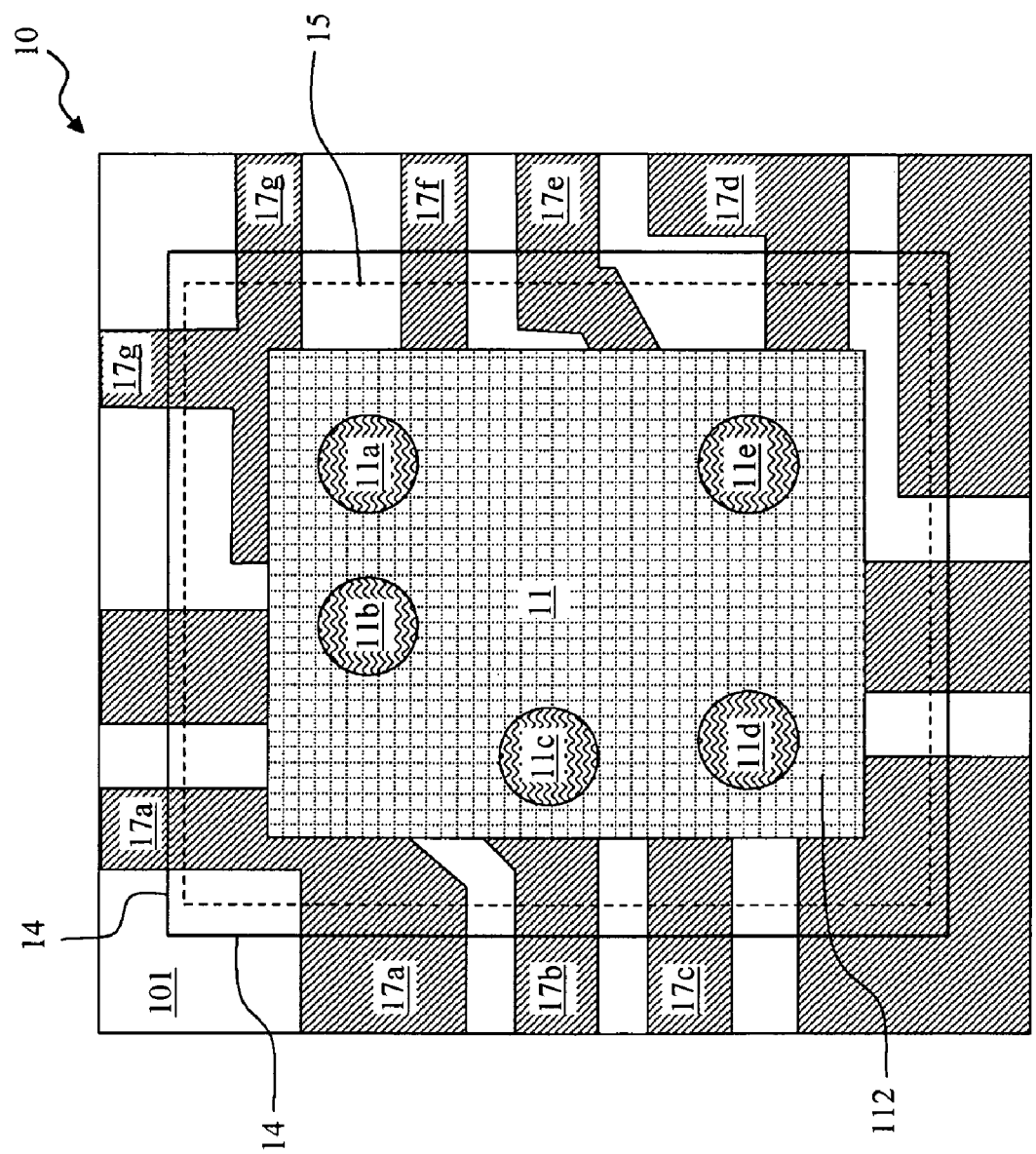
Fig. 1E Present Invention

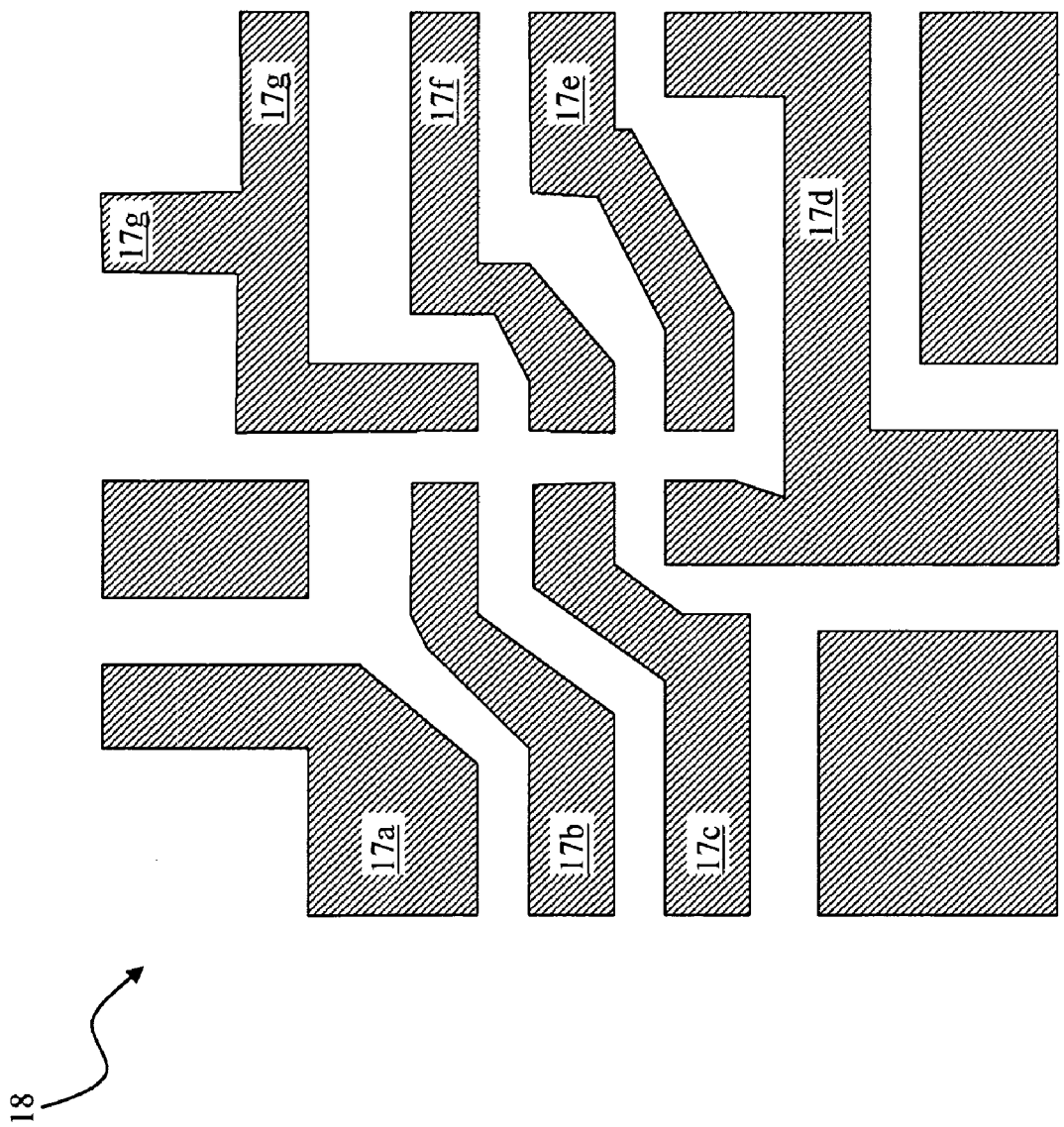
Fig. 1F Present Invention

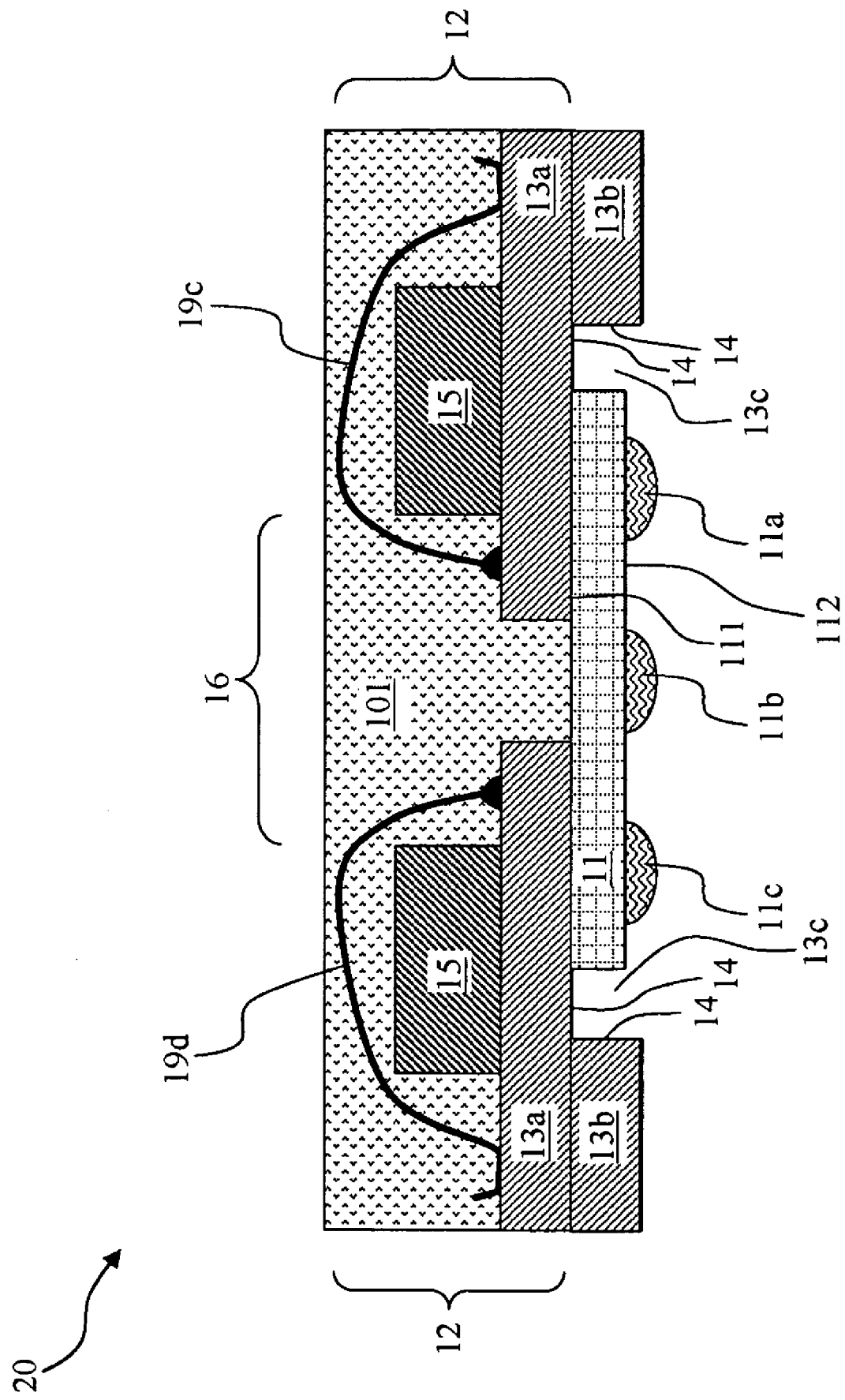
Fig. 2 Present Invention

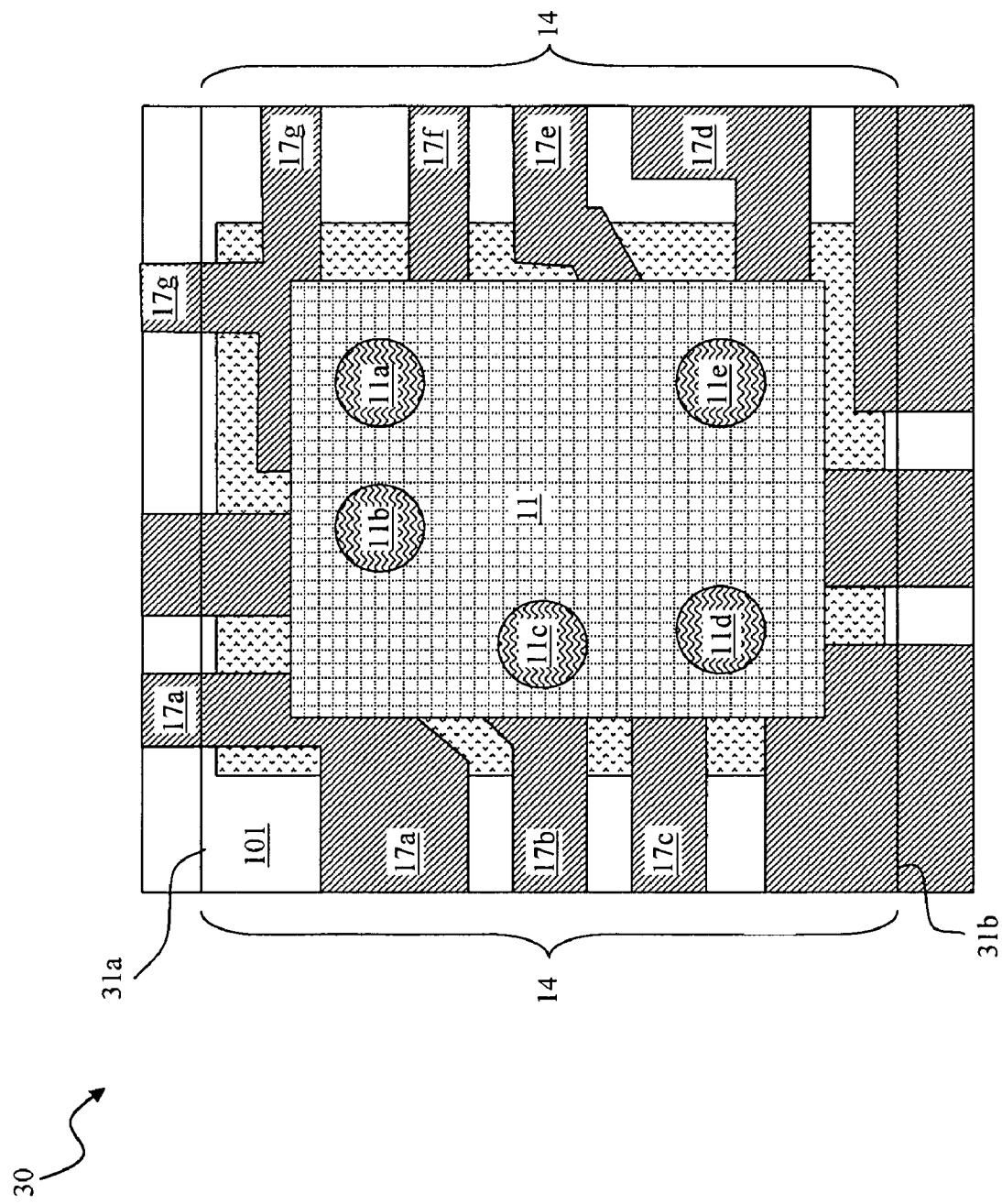
Fig. 3A Present Invention

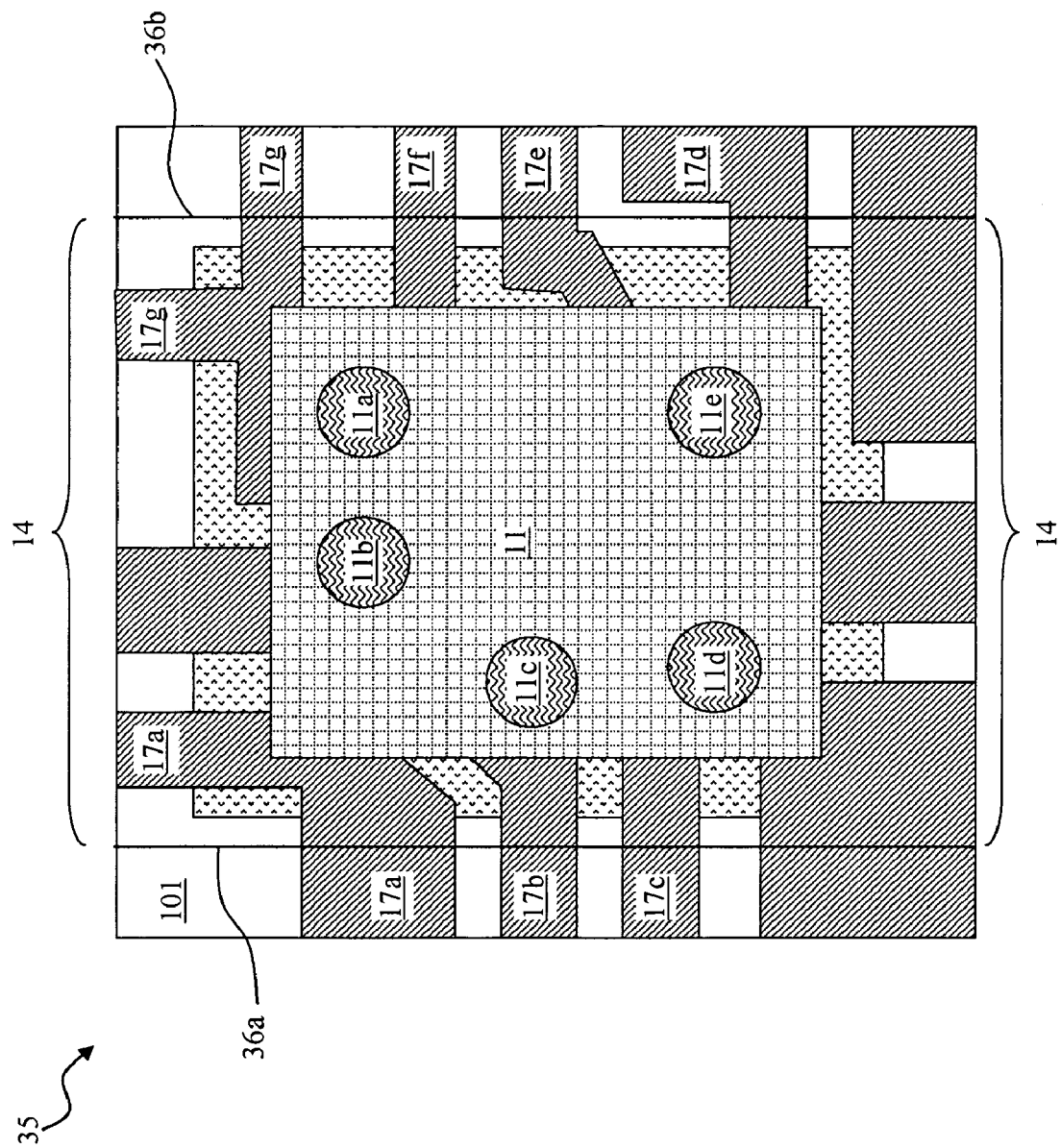
Fig. 3B Present Invention

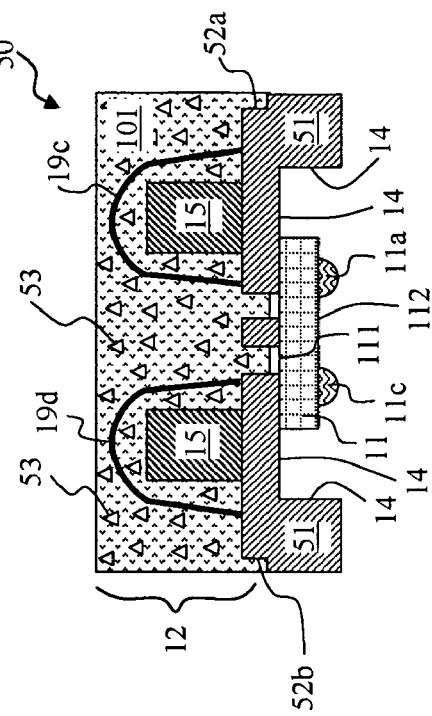
Fig. 5 Present Invention
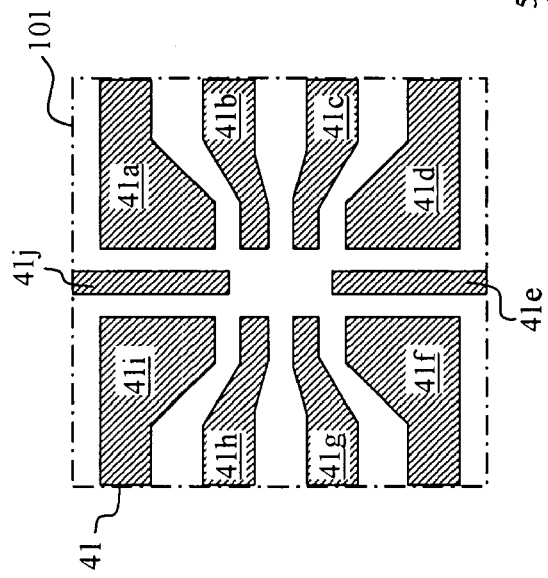
Fig. 4B Present Invention
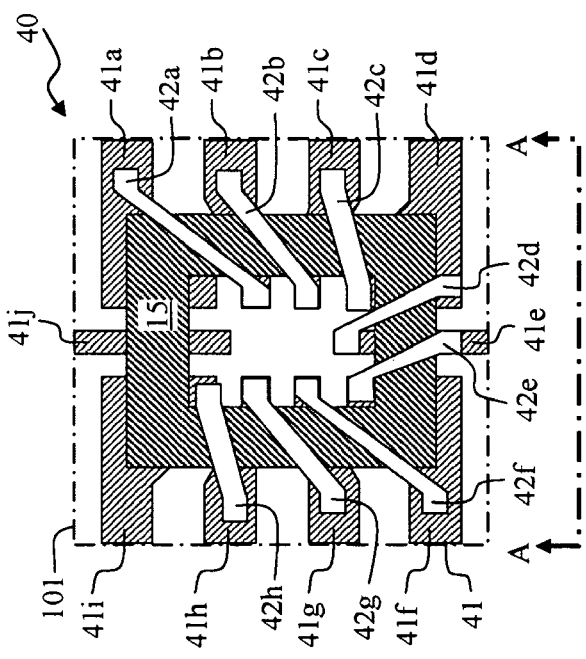
Fig. 4A Present Invention
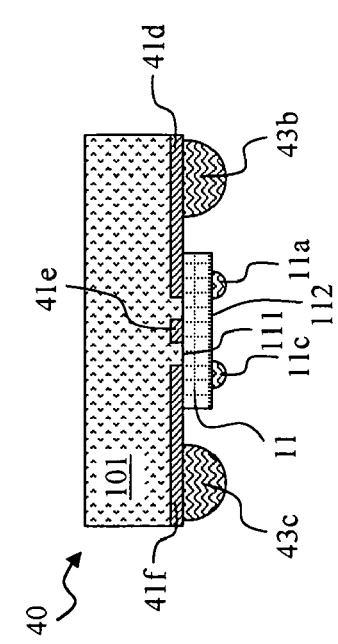
Fig. 4C Present Invention View A-A

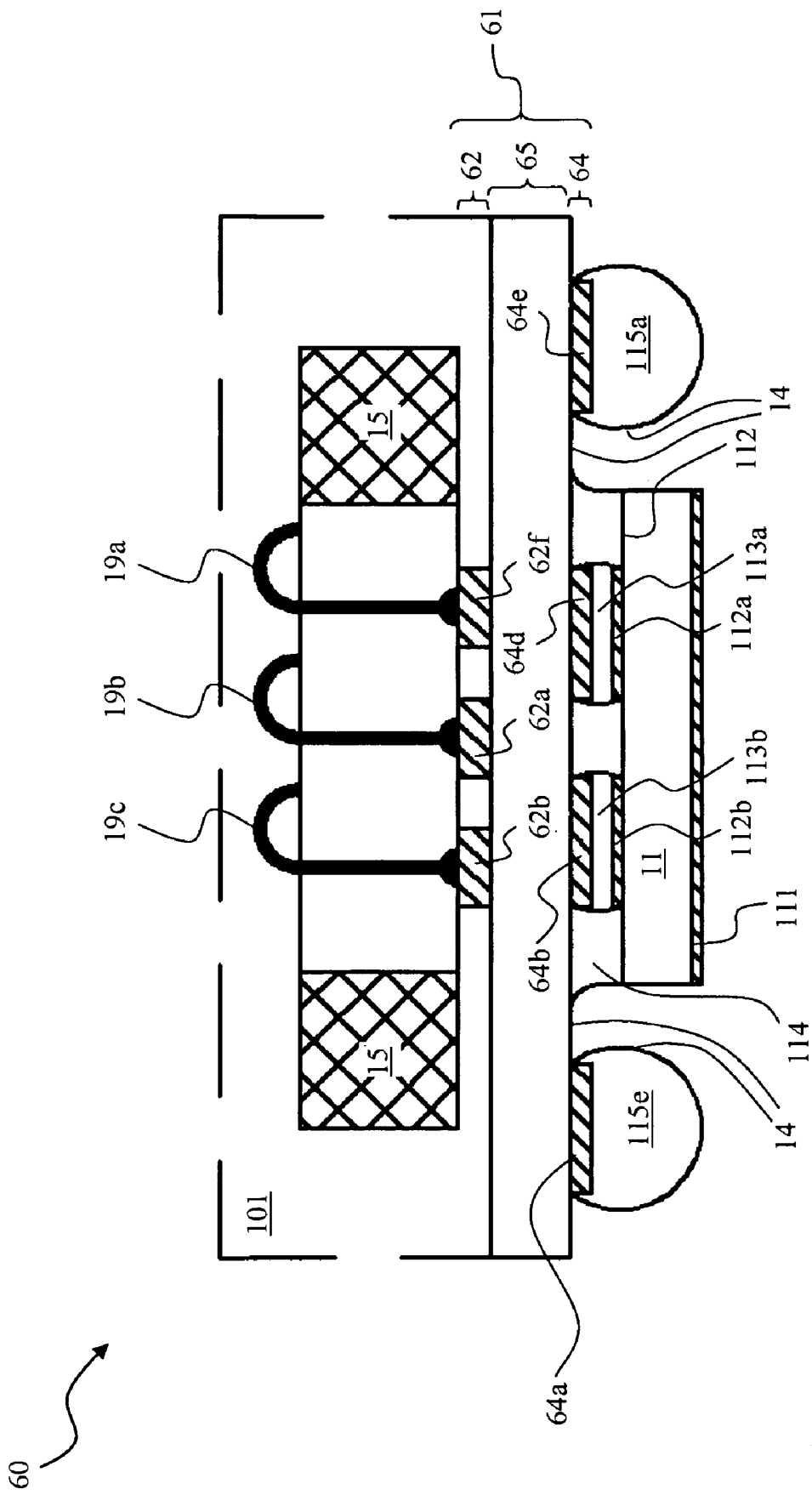
Fig. 6A Present Invention

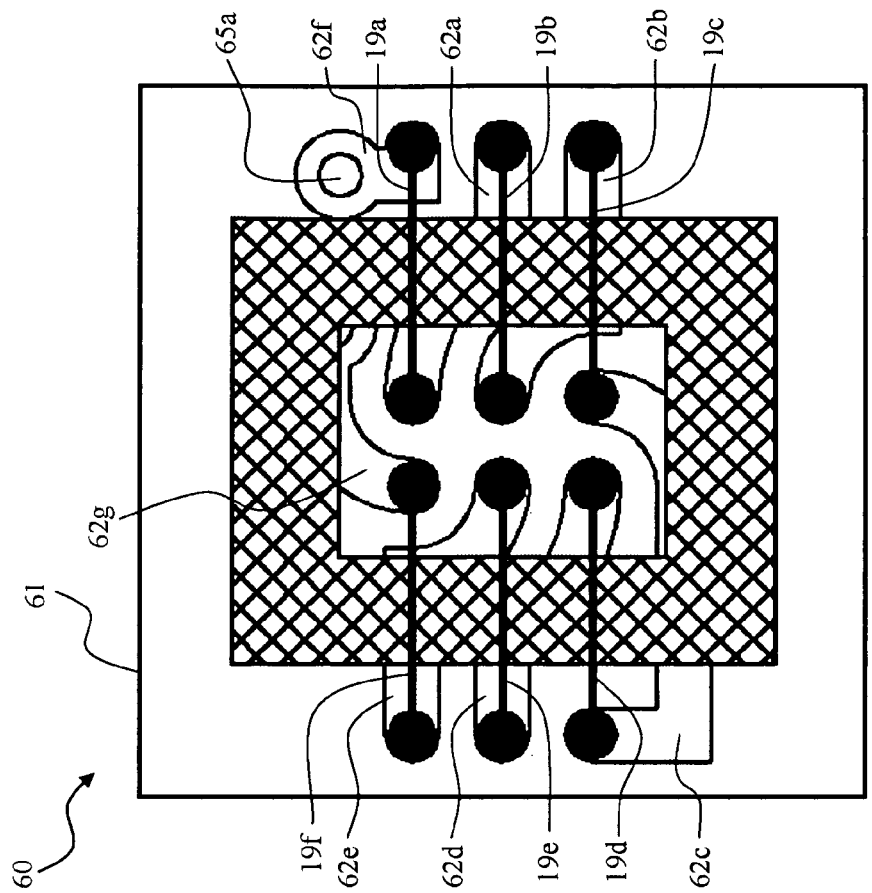
Fig. 6D Present Invention
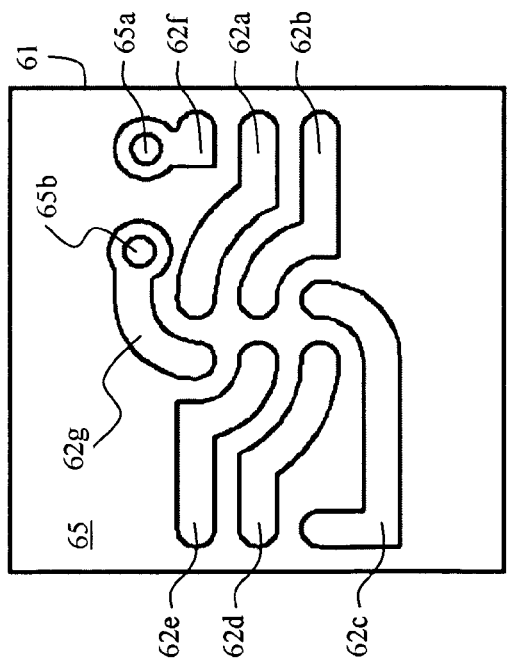
Fig. 6B Present Invention
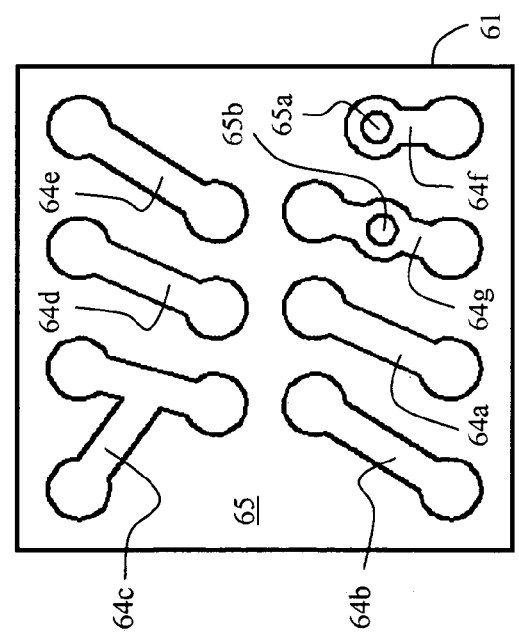
Fig. 6C Present Invention

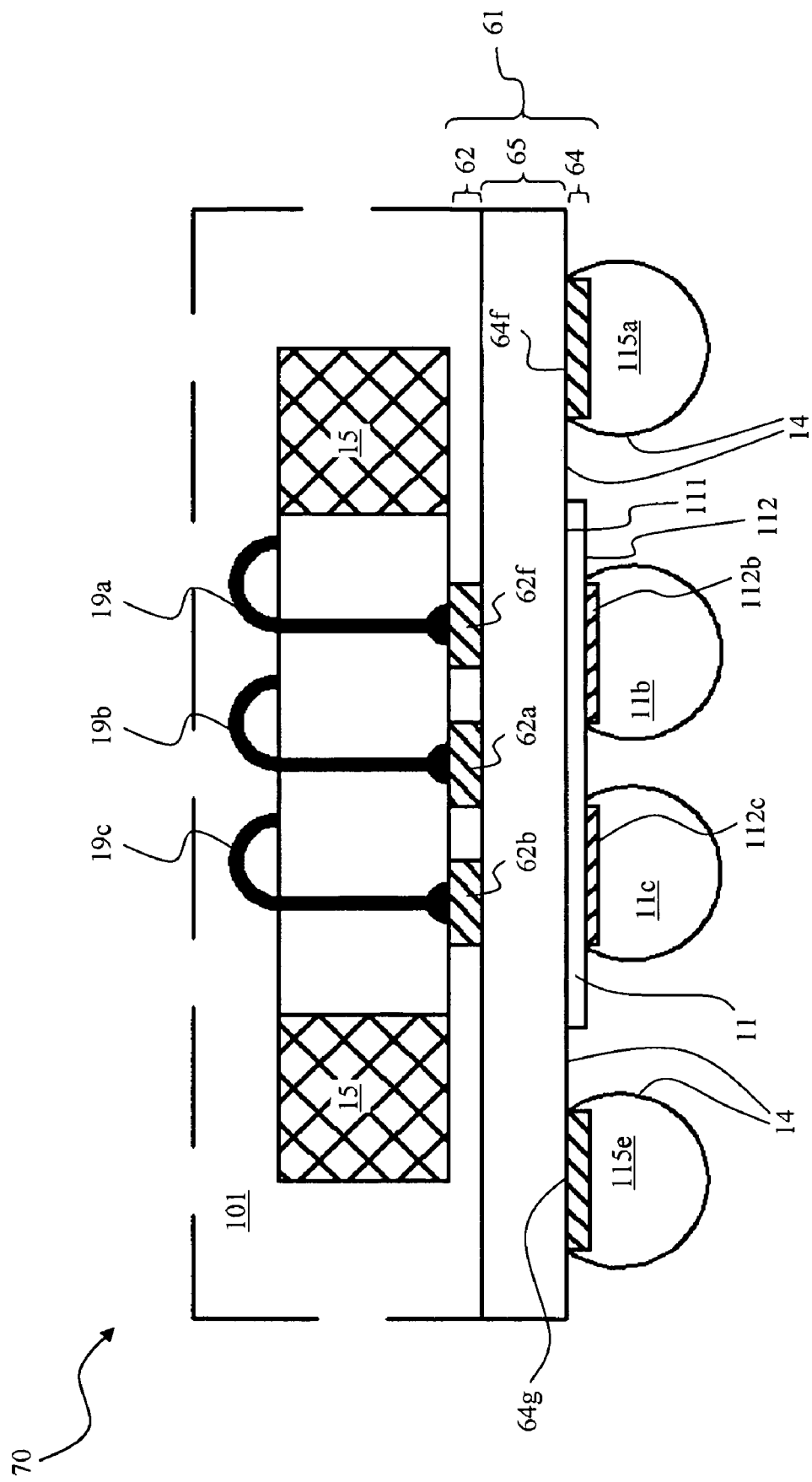
Fig. 7A Present Invention

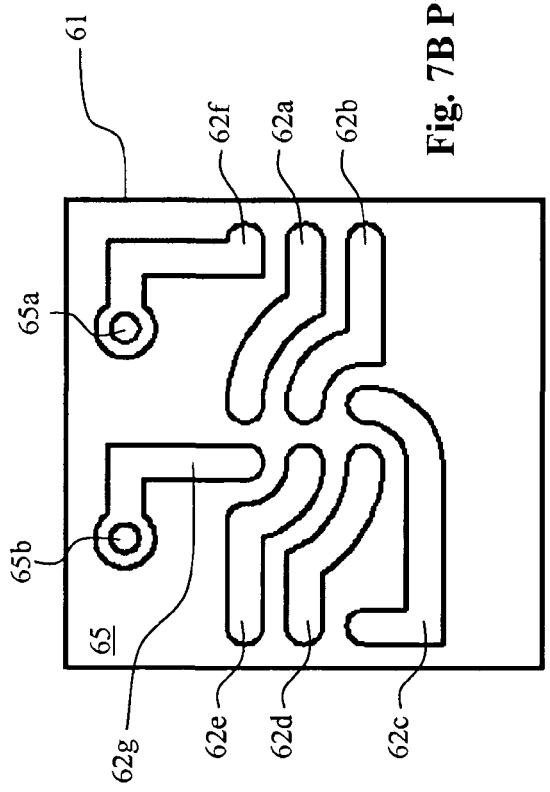
Fig. 7B Present Invention
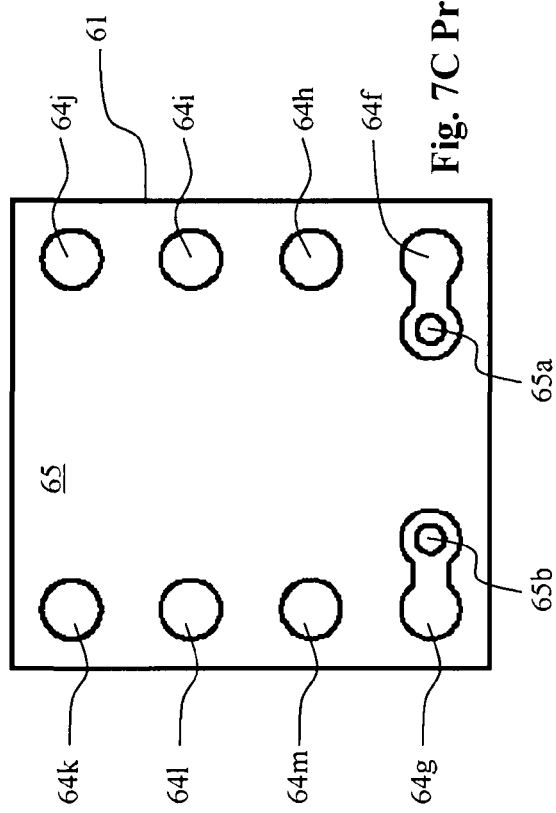
Fig. 7C Present Invention

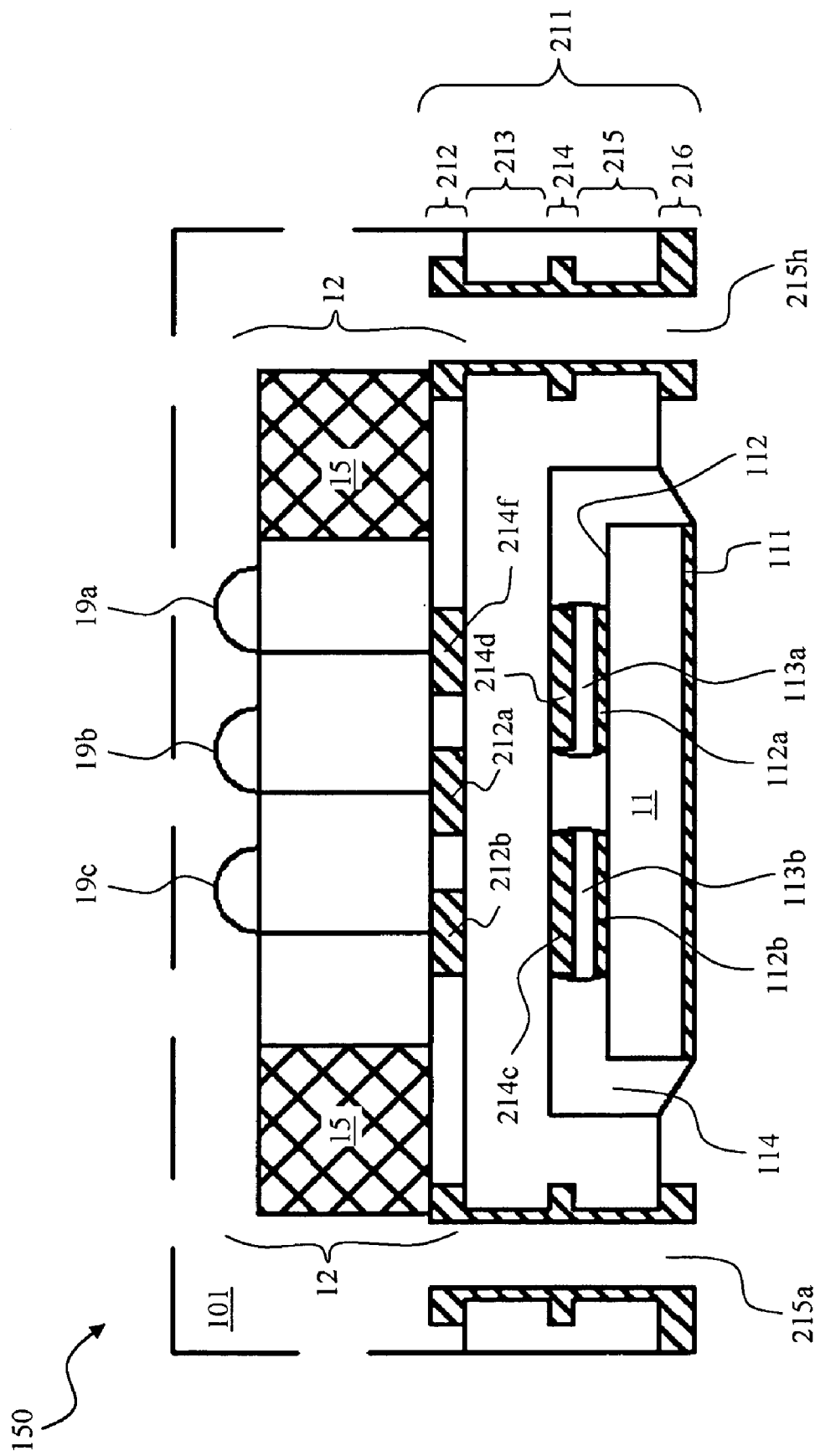
Fig. 8A Present Invention

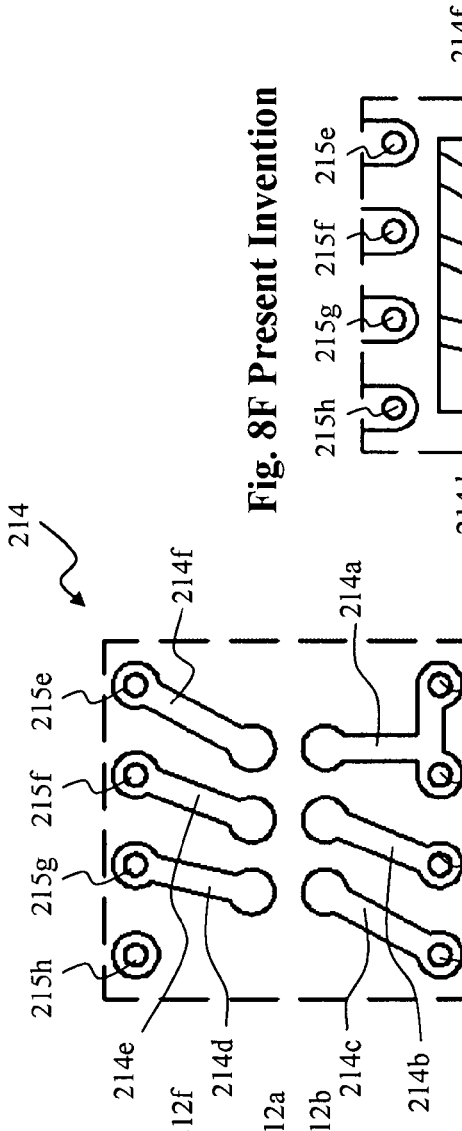
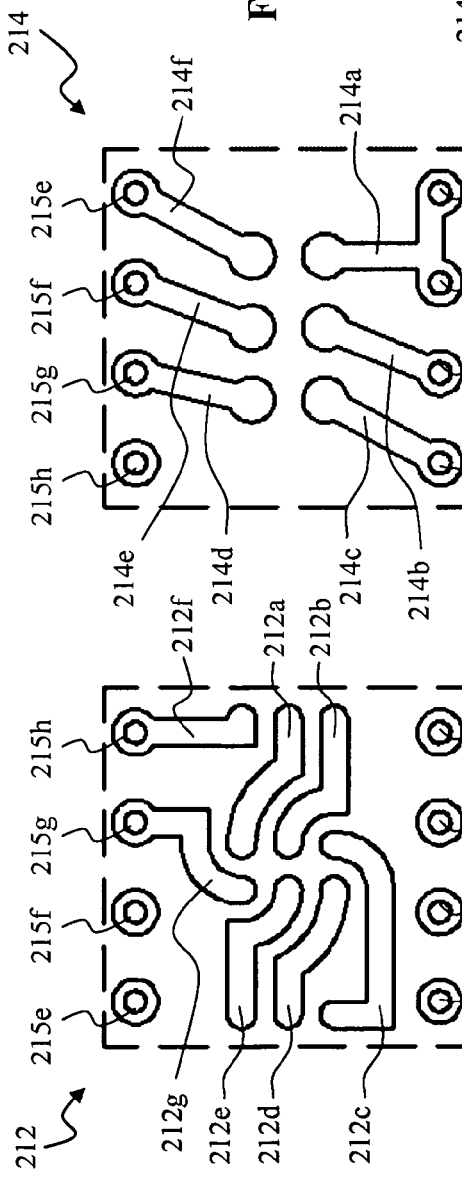
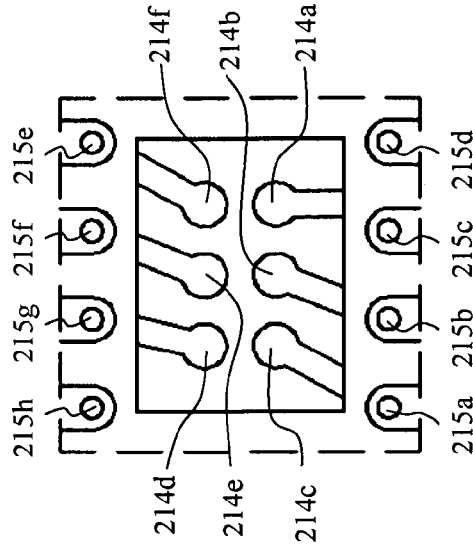
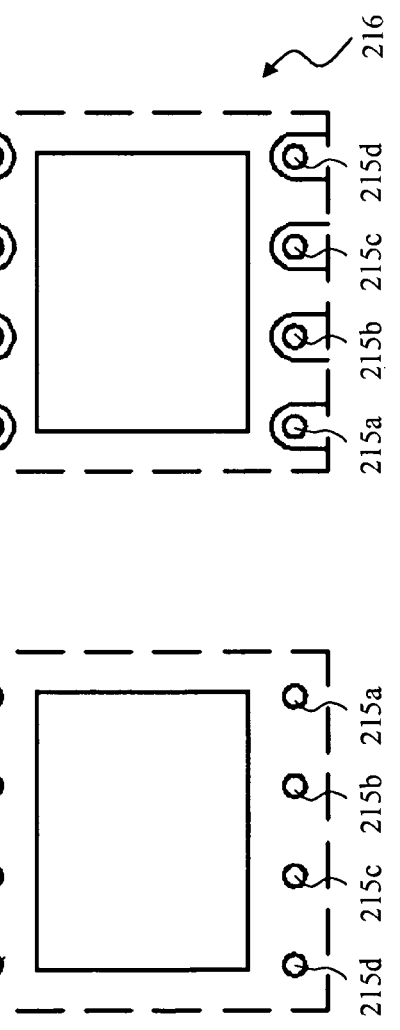

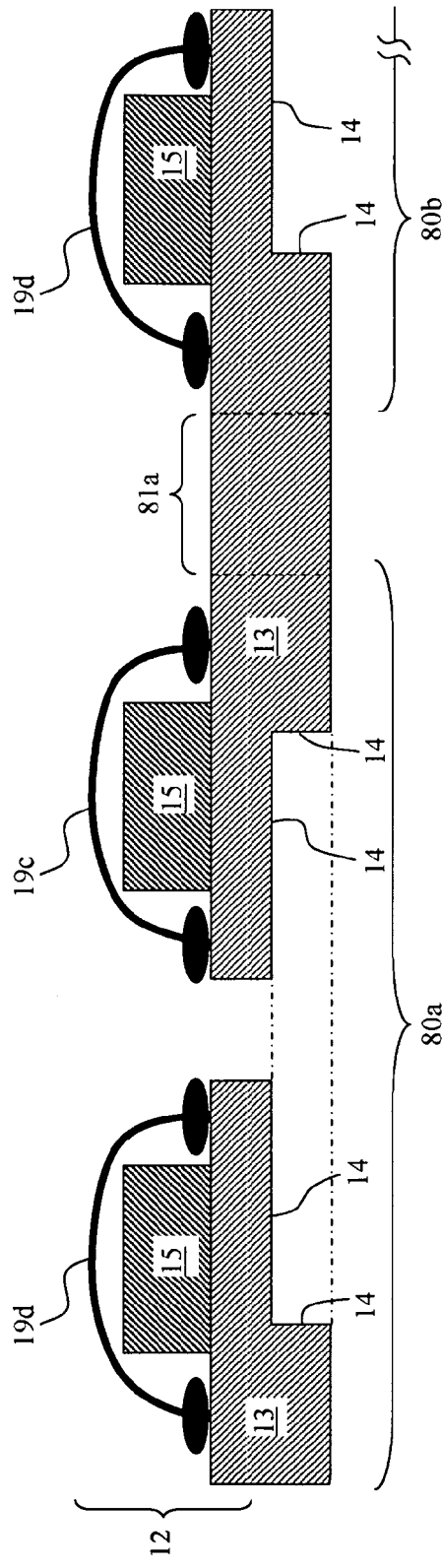
Fig. 9A Present Invention
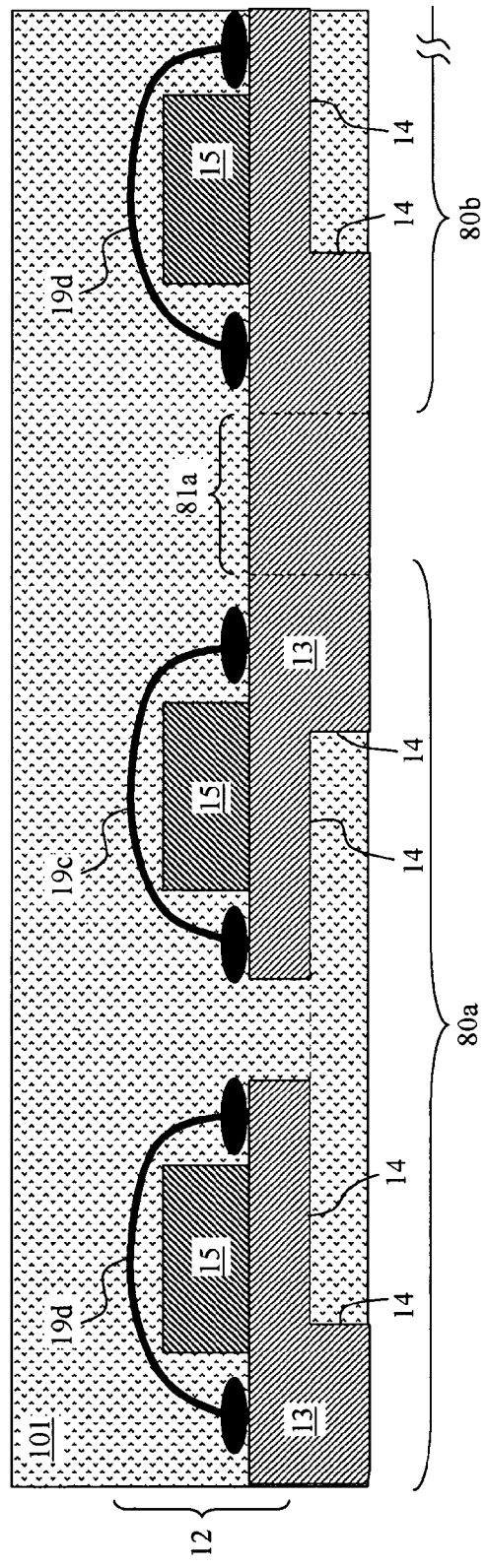
Fig. 9B Present Invention

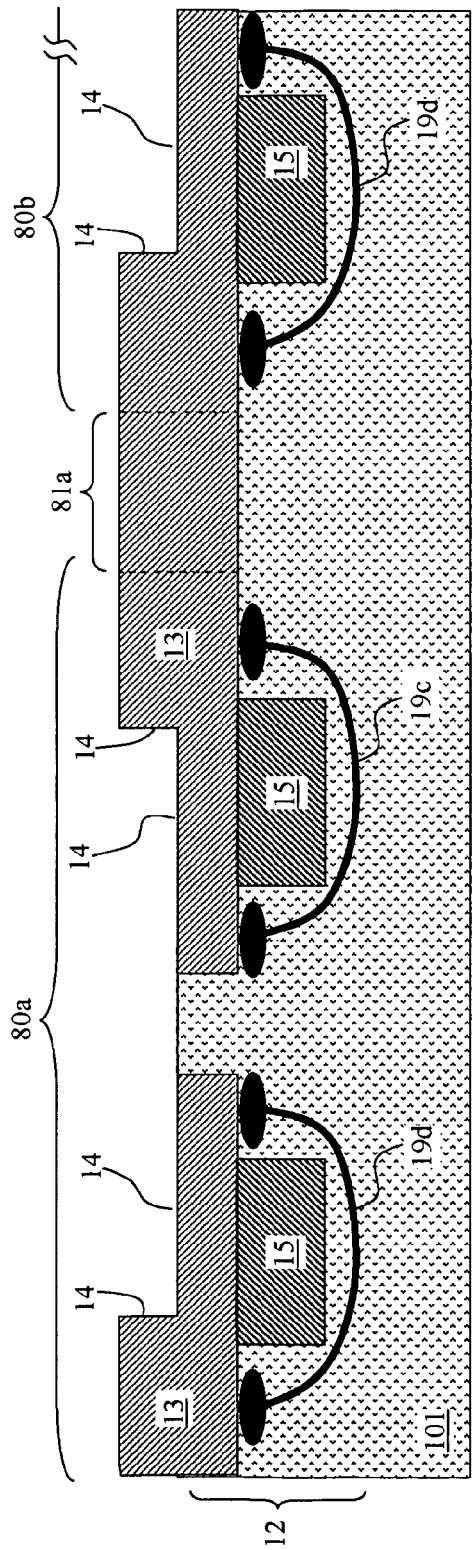
Fig. 9C Present Invention
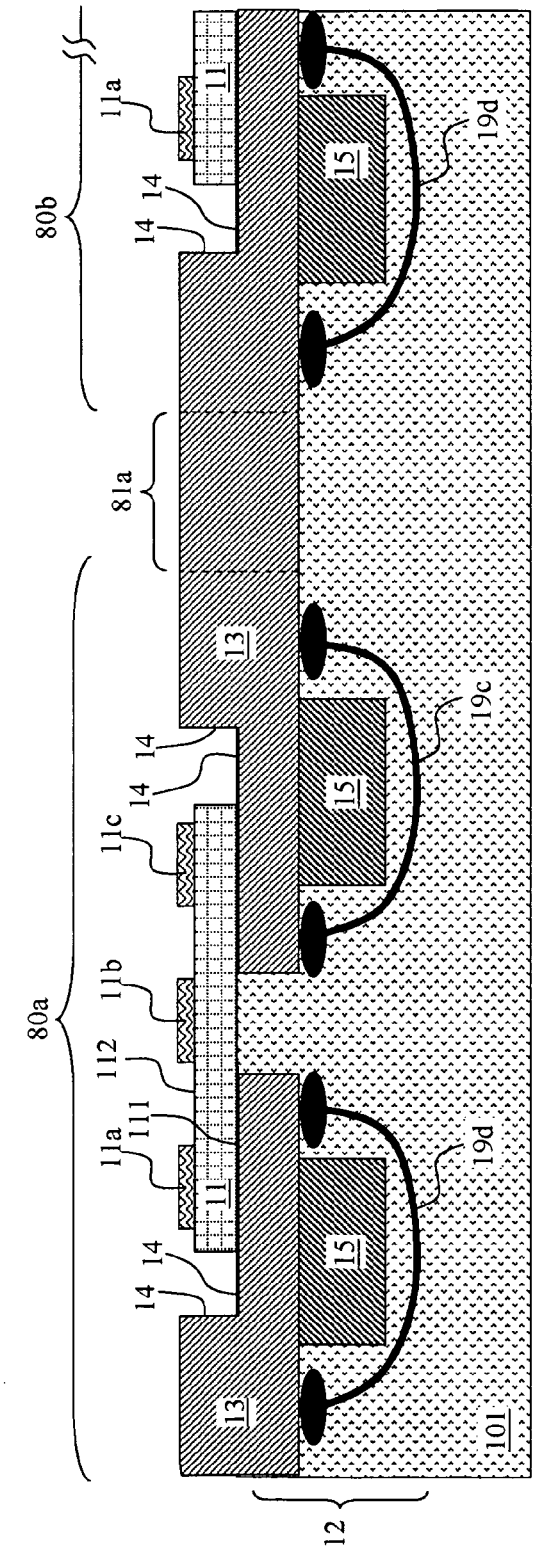
Fig. 9D Present Invention

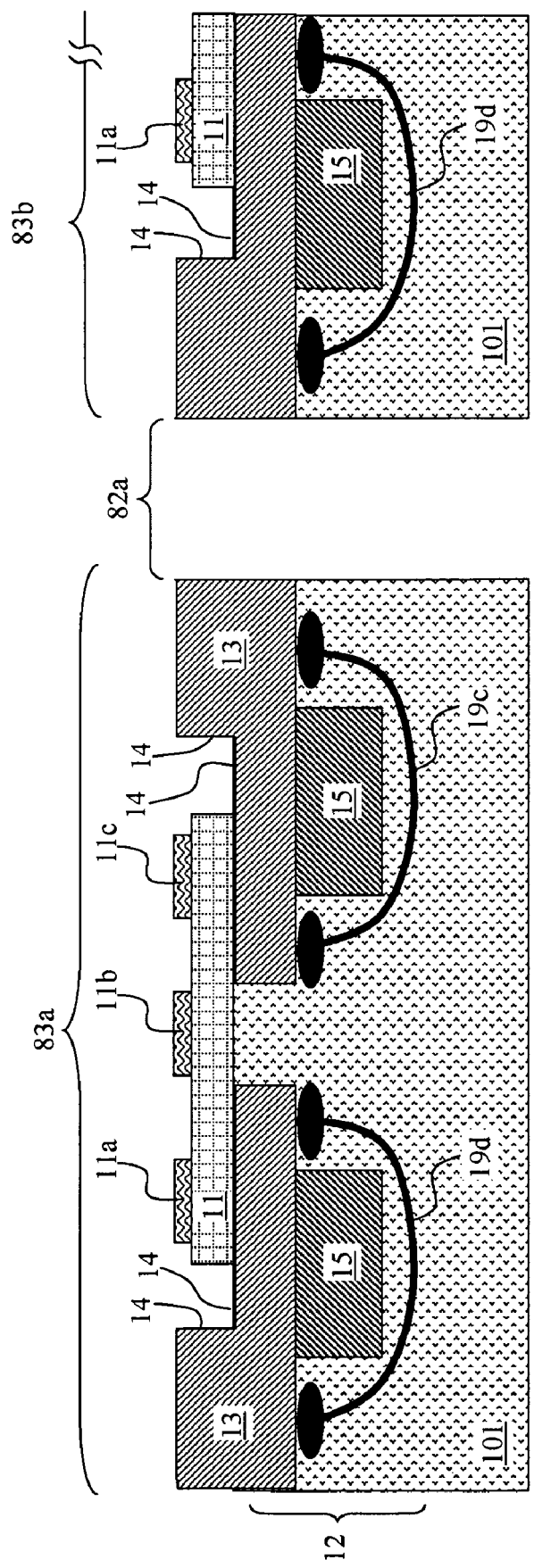
Fig. 9E Present Invention

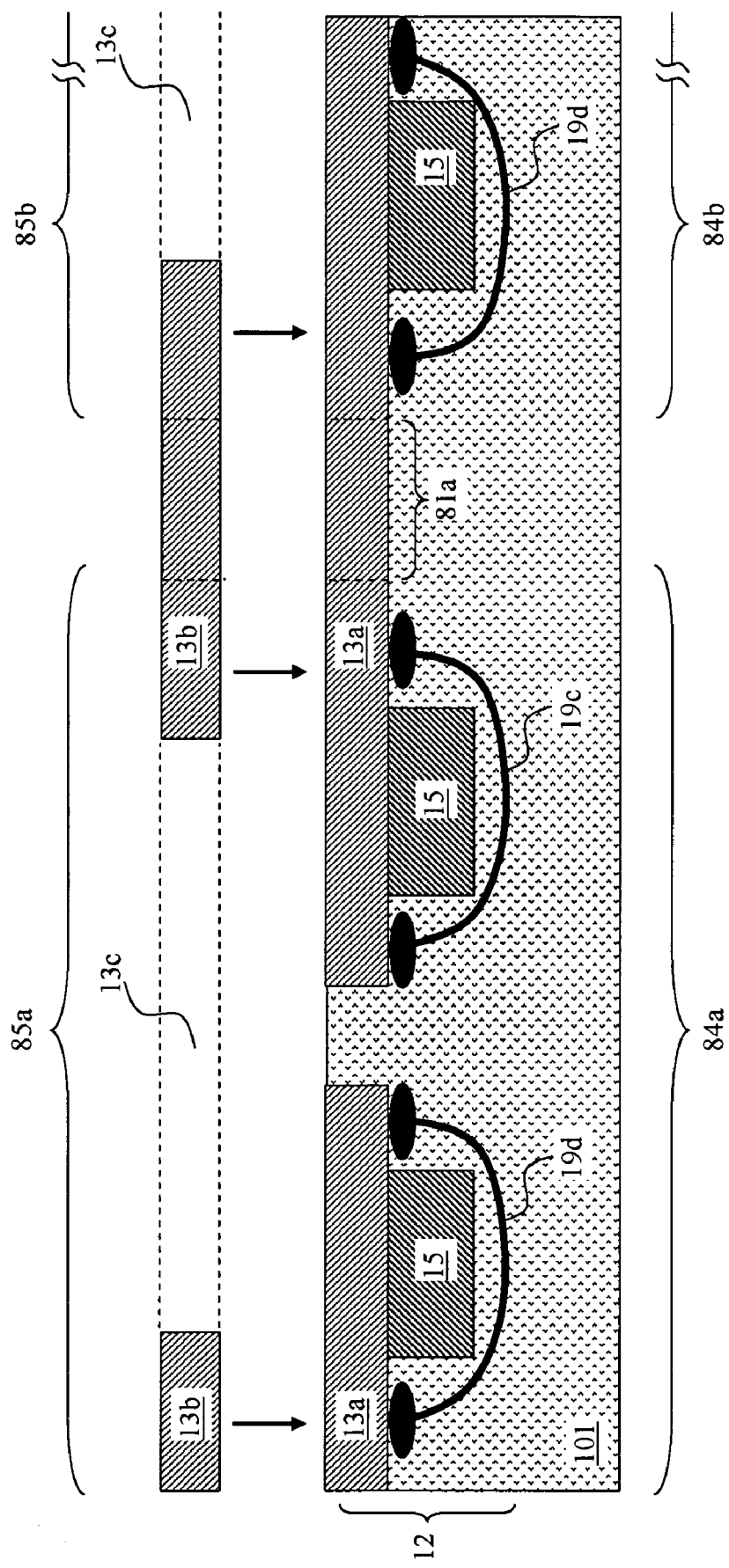
Fig. 10A Present Invention

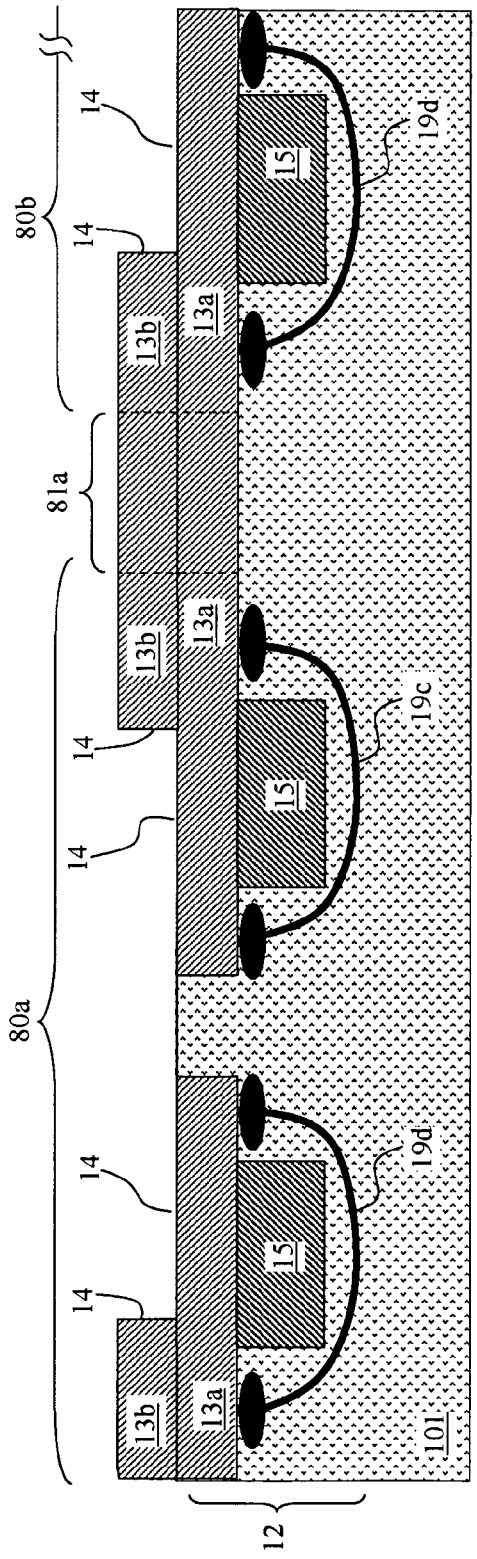
Fig. 10B Present Invention
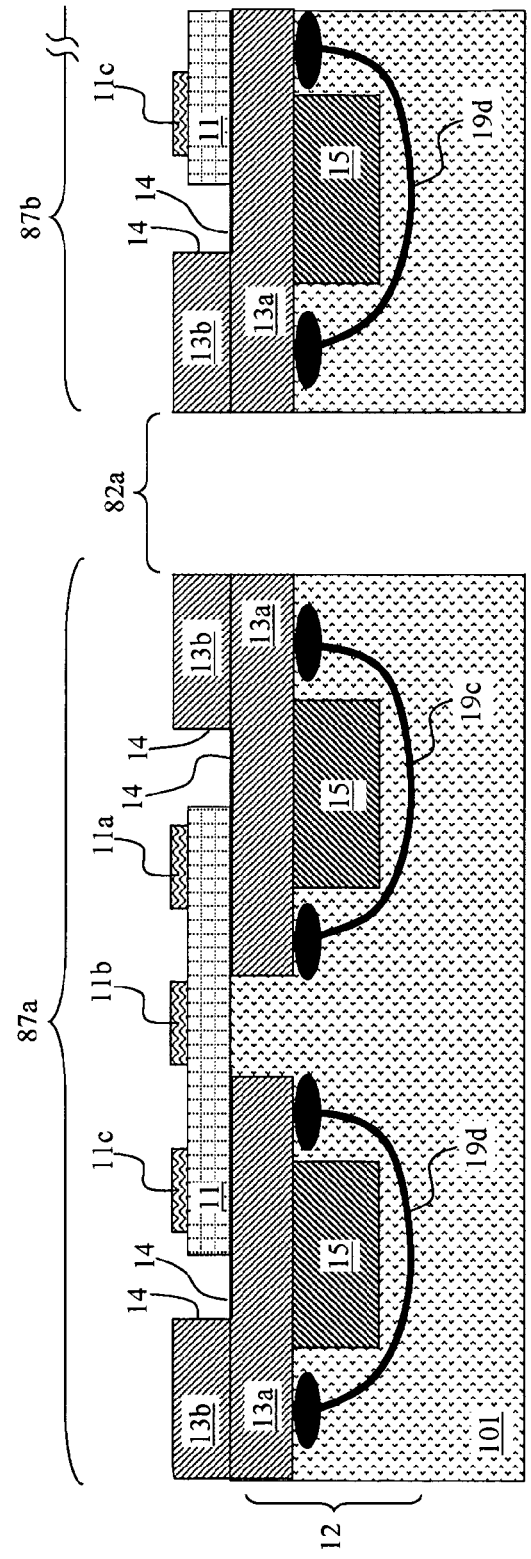
Fig. 10C Present Invention

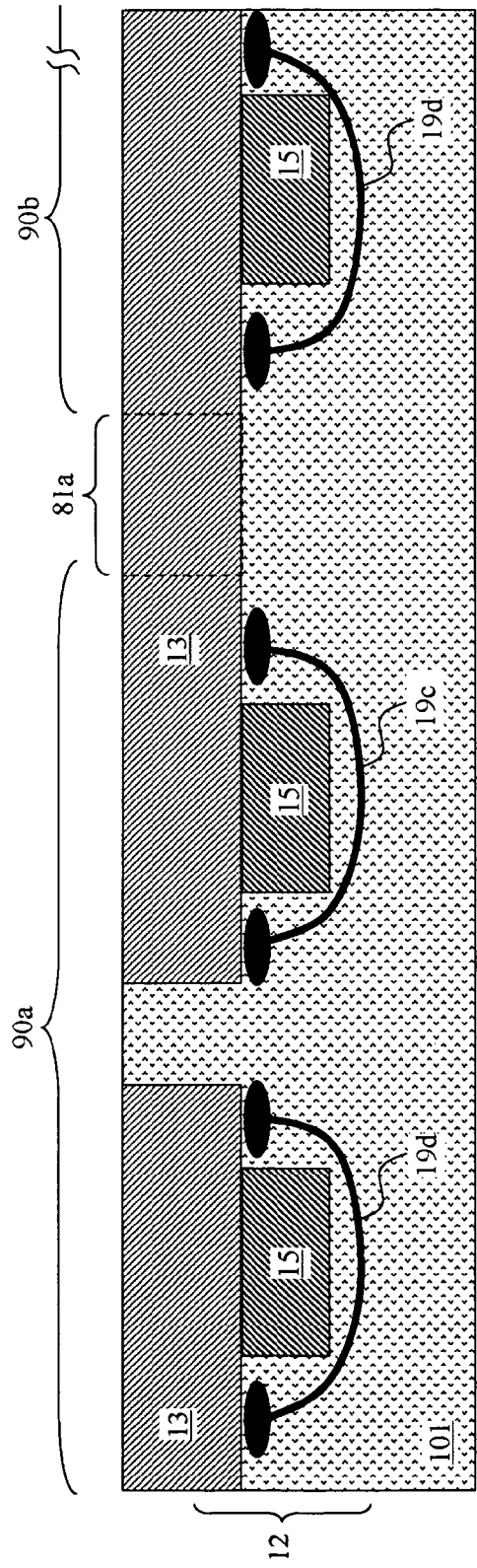
Fig. 11A Present Invention
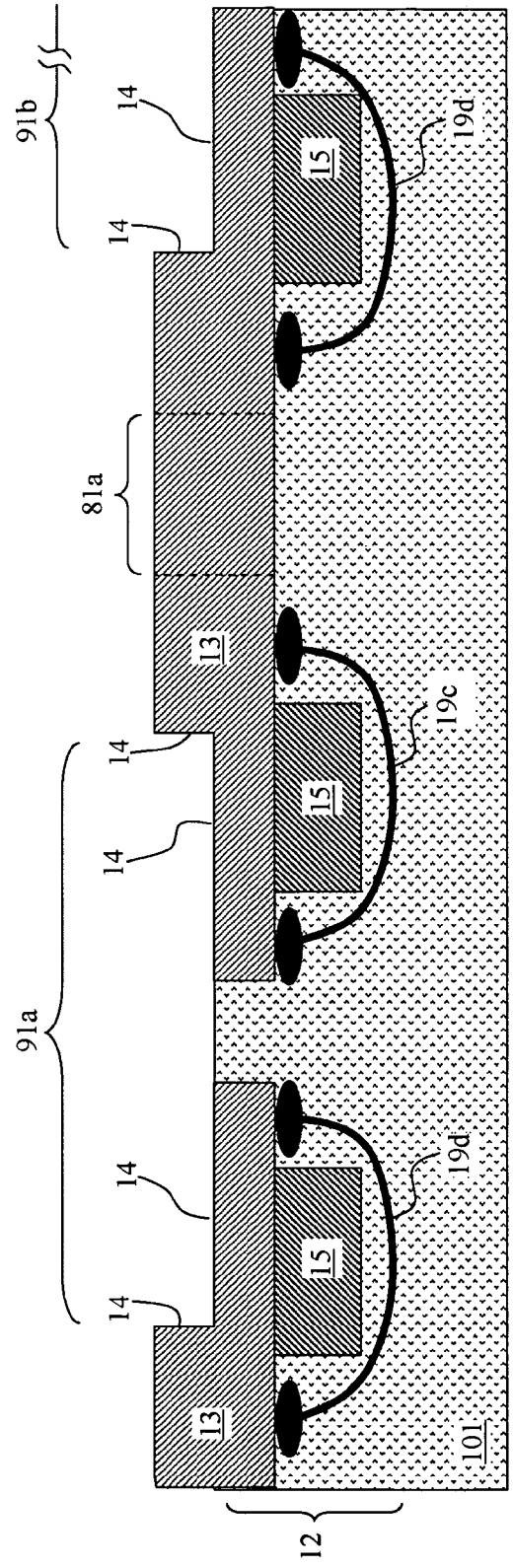
Fig. 11B Present Invention

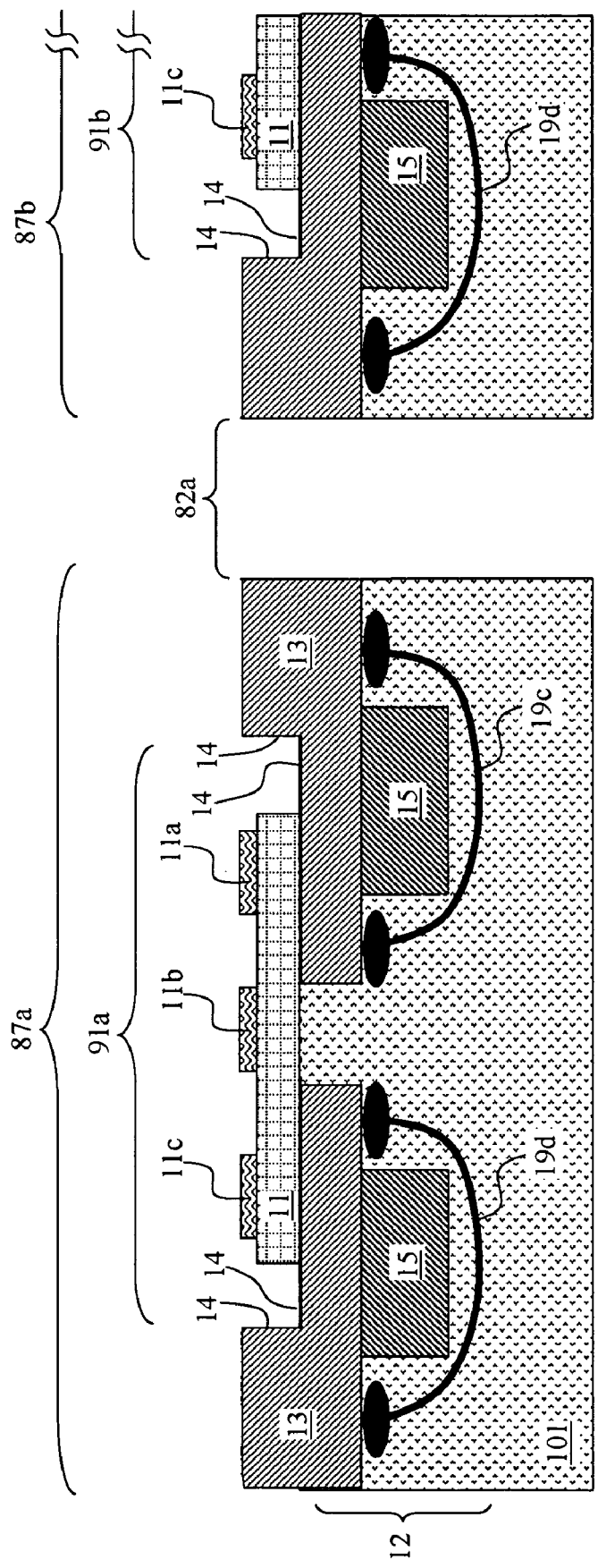
Fig. 11C Present Invention

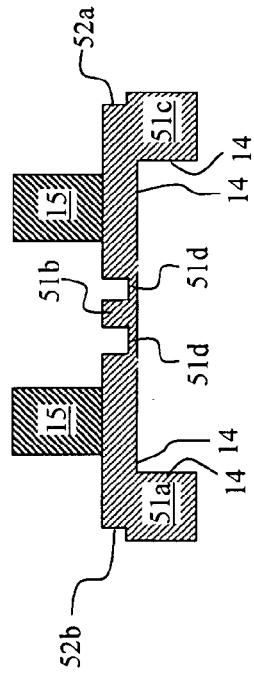
Fig. 12A Present Invention
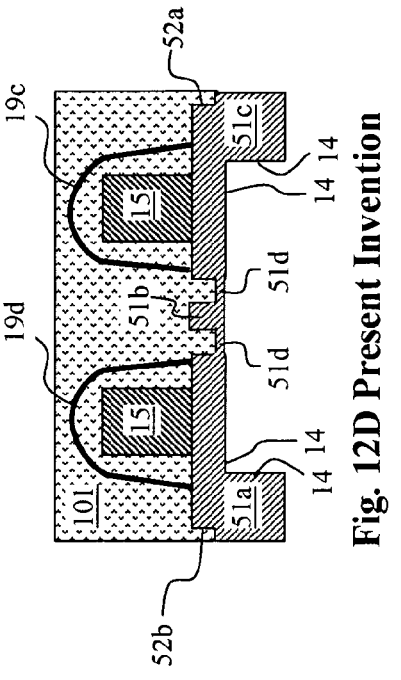
Fig. 12C Present Invention
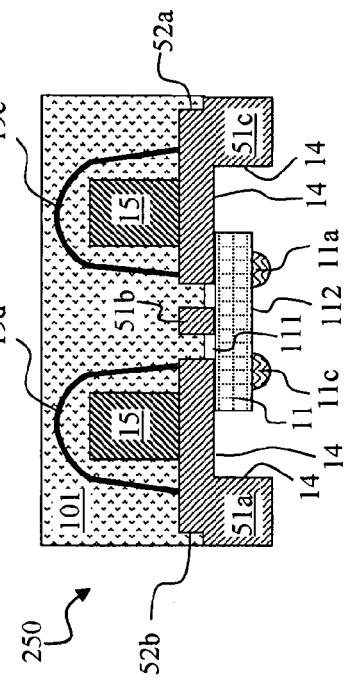
Fig. 12E Present Invention
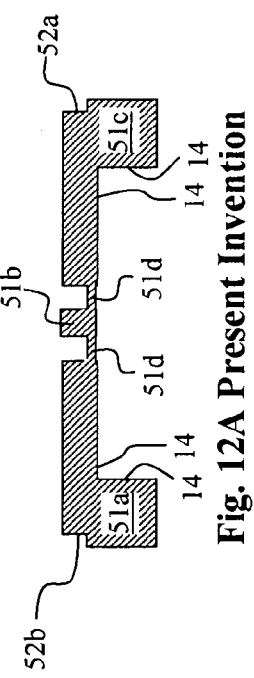
Fig. 12B Present Invention
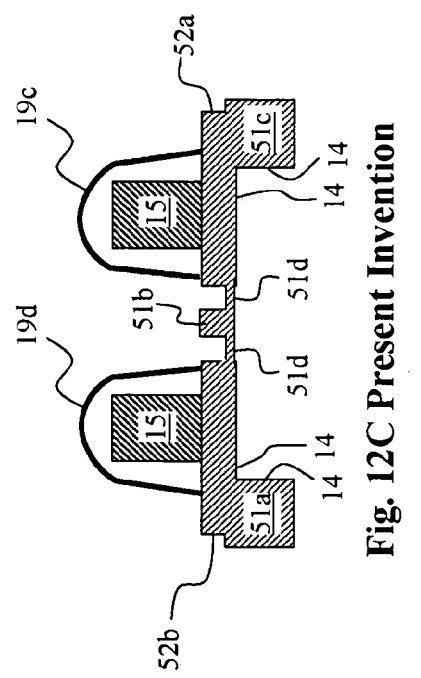
Fig. 12D Present Invention
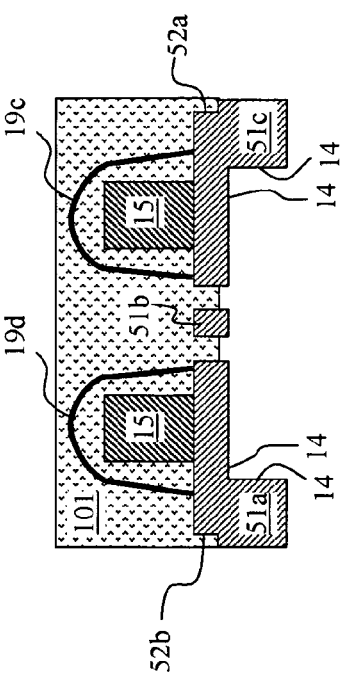
Fig. 12F Present Invention

US 7,868,431 B2

COMPACT POWER SEMICONDUCTOR PACKAGE AND METHOD WITH STACKED INDUCTOR AND INTEGRATED CIRCUIT DIE

CROSS REFERENCE TO RELATED APPLICATIONS

The present invention is a continuation in part application of:
1. application Ser. No. 11/986,673 filed on Nov. 23, 2007 and entitled "Semiconductor Power Device Package Having a Lead Frame-Based Integrated Inductor" by Tao Feng et al
2. application Ser. No. 12/011,489 filed on Jan. 25, 2008 and entitled "LEAD FRAME-BASED DISCRETE POWER INDUCTOR" by François Hébert et al the entire disclosure of the above is hereby incorporated by reference. The present invention is also related to the following commonly assigned patent applications:
1. application Ser. No. 11/729,311, publication# US20080238599 filed on Mar. 27, 2007 and entitled "Chip Scale Power Converter Package Having An Inductor Substrate" Francois Hebert et al
2. application Ser. No. 11/818,219, publication# US20080309442 filed on Jun. 12, 2007 and entitled "Semiconductor Power Device Having a Stacked Discrete Inductor structure" Francois Hebert
3. application Ser. No. 11/906,136, publication# US20080087992 filed on Sep. 28, 2007 and entitled "Semiconductor package having a bridged plate interconnection" by Lei Shi et al whose content are also incorporated herein by reference.

FIELD OF INVENTION

This invention relates generally to the field of electronic system packaging. More specifically, the present invention is directed to the physical level packaging of semiconductor dies and inductive components.

BACKGROUND OF THE INVENTION

Due to ongoing market demand, power semiconductor packages are continuously being driven toward smaller size and/or footprint while handling increasing power levels. One common power semiconductor package for a variety of power converters (boost and buck converters, etc.) deals with the packaging of semiconductor dies and inductive components. An example of such power converter circuits is illustrated as power semiconductor circuit 1 of FIG. A. An input supply VIN (2.5V to 5.5V) gets converted into a regulated output voltage VOUT (rated output current=500 mA) with a circuit comprising a controller Integrated Circuit (IC) AOZ1505DI, a power inductor (L1, 1 microHenry) plus two resistors R1 and R2. Optionally, the resistors R1, R2 and other circuit components can be integrated within the controller IC AOZ1505DI as well. However, the required coil structure and size of the power inductor L1 have necessitated its implementation into a component separate from the power controller IC die. As a result, how to compactly integrate the power inductor with the power controller IC die remains to be a major challenge at the final packaging level for the power converter circuit. Many related prior arts were described in the above-cited applications for cross reference. The present invention targets a power semiconductor package with a reduced package foot print while exhibiting a high inductance rating which includes inductance value, inductor current rating and also its saturation current.

SUMMARY OF THE INVENTION

A compact power semiconductor package is disclosed with high inductance rating while exhibiting a reduced package foot print. It has:
a) A bonded stack of a power Integrated Circuit (IC) die at the bottom, a power inductor at the top and a circuit substrate in the middle.
b) The power inductor has an inductor core (e.g., ferrite chip) in the form of a closed magnetic loop, such as a toroid, located atop the circuit substrate. The inductor core has an interior window.
c) The circuit substrate has a first number of bottom half-coil forming conductive elements positioned beneath the inductor core.
d) A second number of top half-coil forming conductive elements located atop the inductor core with both ends of each connected to proper respective bottom half-coil forming conductive elements within the window of the inductor core and about the inductor core so as to jointly form an inductive coil enclosing the inductor core.
e) A top encapsulant protectively encasing the inductor core, the top half-coil forming conductive elements, the bottom half-coil forming conductive elements and the circuit substrate.

As a refined embodiment, top surface of the circuit substrate can include numerous geometric encapsulant locking features for strengthening the anchoring of the top encapsulant atop the power semiconductor package.

As another refined embodiment, the top encapsulant can be made of a molding compound with embedded magnetic particles to increase the inductance rating. The inductor core can be made with at least one air gap along its magnetic loop for adjustment of its inductance.

As another refined embodiment, ones of the top half-coil forming means couple the ends of ones of the bottom half-coil forming means exposed through the interior window of the inductor core to the ends of adjacent ones of the bottom half-coil forming means outside the inductor core to form the inductive coil.

In a more specific embodiment, the circuit substrate is a leadframe and the bottom half-coil forming conductive elements are numerous half-coil patterned conductive leads each being part of the leadframe. Correspondingly, the top half-coil forming conductive elements can be made of:
1. Numerous bond wires each looping the inductor core from above and also connected to proper alternative members of the half-coil patterned conductive leads thus forming the inductive coil. Or alternatively:
2. Numerous three dimensionally formed interconnection plates each looping the inductor core from above and also connected to proper alternative members of the half-coil patterned conductive leads thus forming the inductive coil. Or alternatively:
3. Numerous upper leadframe leads connected to proper alternative members of the half-coil patterned conductive leads thus forming the inductive coil.

A connection chip may also be employed within the interior window of the inductor core in order to facilitate the connection between the top half-coil forming conductive elements and the bottom half-coil forming conductive elements within the window of the inductor core. An outer connection chip may also be employed to facilitate connections about the inductor core. The connection chip may have conductive vias through it which facilitate connection between the top half-coil forming conductive elements and the bottom half-coil forming conductive elements.

The leadframe may also have a bottom recess sized to accommodate the power IC die. The bottom recess can be formed by attaching numerous peripheral standoff bumps at bottom surface of the leadframe with additional benefit of making external connections from the leadframe. Here, the power IC die is configured with its substrate side bonded to a bottom surface of the leadframe and the device side facing away from the leadframe. The device side of the power IC die can also have numerous bottom contact bumps formed on it for making external connections from the power IC die.

As an alternative embodiment, the bottom recess can be formed by patterning or by partially sawing a portion of the bottom of the leadframe.

As an alternative embodiment, the bottom recess can be formed by registering and laminating a top leadframe onto a bottom leadframe. The top leadframe has the half-coil patterned conductive leads constituting the bottom half-coil forming conductive elements. Importantly, the bottom leadframe has been made with an interior hole of pre-determined geometry patterned therein so as to form the bottom recess upon lamination.

As an alternative embodiment, the circuit substrate can be made of a multi-layer circuit laminate (MCL), such as a printed circuit board (PCB), having:
   a) a top conductive trace layer having a first number of half-coil patterned conductive traces constituting the bottom half-coil forming conductive elements and a second number of top conductive traces.
   b) a bottom conductive trace layer having numerous bottom conductive traces.
   c) an intervening insulation layer in the middle for isolating the top conductive trace layer from the bottom conductive trace layer.

Owing to the interconnection and isolation flexibility of the MCL, the power IC die can be configured with either its device side bonded to a bottom surface of the MCL and the substrate side facing away from the MCL or the other way around. The intervening insulation layer can include numerous conductive through holes for electrically connecting a first number of selected half-coil patterned conductive traces with a second number of selected bottom conductive traces hence making electrical connection between the power IC die and the power inductor, and allowing connection from the power inductor to external circuits. Additionally, the bottom conductive traces can include electrical routs to connect contacts from the power IC die to the periphery of the MCL.

As another refinement, the bottom surface of the MCL can have numerous peripheral standoff bumps attached to it for forming a bottom recess sized to accommodate the power IC die and for making external connections from the MCL.

A process is disclosed for making multiple units of the above compact power semiconductor package. The process includes:
   a) Patterning a set of multiple circuit substrates with each circuit substrate having the bottom half-coil forming conductive elements on it.
   b) Structuring multiple power IC dies so that each power IC die is ready for a chip bonding process.
   c) Providing multiple inductor cores and multiple top half-coil forming conductive elements.
   d) Attaching a inductor core to the bottom half-coil forming conductive elements.
   e) At each circuit substrate location along the set:
      e1) Aligning the top half-coil forming conductive elements atop the inductor core and interconnecting the top half-coil forming conductive elements with the bottom half-coil forming conductive elements to form a sub-package unit with an inductive coil enclosing the inductor core.
      e2) Applying a top encapsulant to protectively encase the top of each sub-package unit.
      e3) Aligning and bonding a power IC die beneath the sub-package unit to form a package unit.
   f) Separating the package unit from the set.

As a more specific embodiment, patterning the set of multiple circuit substrates further includes creating, on each circuit substrate, a bottom recess sized to accommodate the power IC die. Creating the bottom recess can be done by etching the bottom side of each circuit substrate or by partially sawing the bottom side of each circuit substrate, or by simply providing a MCL already possessing a bottom recess in it.

For the case where the circuit substrate is made of leadframe, creating the bottom recess can also be done by:
   1 Providing a top leadframe with numerous half-coil patterned conductive leads forming the bottom half-coil forming conductive elements.
   2. Providing a bottom leadframe with an interior hole of pre-determined geometry patterned in it then laminating the bottom leadframe to the bottom of the top leadframe so as to form the bottom recess.

As an alternative embodiment of accommodating the power IC die, a number of properly sized peripheral standoff bumps can be, following step e2), attached onto the bottom of each circuit substrate.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. A illustrates a common power converter circuit with a controller IC die and a power inductor at its final packaging level;

FIG. 1A through FIG. 1F illustrate a first embodiment of the present invention compact power semiconductor package having a stack of power inductor, leadframe and power IC die;

FIG. 2 illustrates a second embodiment of the present invention compact power semiconductor package using two laminated leadframes;

FIG. 3A and FIG. 3B illustrate a third embodiment of the present invention using partially sawn leadframes;

FIG. 4A through FIG. 4C illustrate a fourth embodiment of the present invention using peripheral standoff bumps at its bottom and top half-coil forming interconnection plates at its top;

FIG. 5 illustrates a fifth embodiment of the present invention using an encapsulant molding compound with embedded magnetic particles and a leadframe with numerous geometric encapsulant locking features;

FIG. 6A through FIG. 6D illustrate a sixth embodiment of the present invention that is similar to the first embodiment except for the replacement of the leadframe with a two-layer printed circuit board bonding the device side of the power IC die;

FIG. 7A through FIG. 7C illustrate a seventh embodiment of the present invention that is similar to the sixth embodiment except that the power IC die is configured to have its substrate side bonded to the two-layer printed circuit board;

FIG. 8A through FIG. 8F illustrate an eighth embodiment of the present invention that is similar to the first embodiment except for the replacement of the leadframe with a three-layer printed circuit board bonding the device side of the power IC die;

FIG. 9A through FIG. 9E illustrate a first process for making multiple units of the compact power semiconductor package of FIG. 1A;

FIG. 10A through FIG. 10C illustrate a second process for making multiple units of the compact power semiconductor package of FIG. 2;

FIG. 11A through FIG. 11C illustrate a third process for making multiple units of the compact power semiconductor package of FIG. 3B; and FIG. 12A through FIG. 12F illustrate a variation of the first process of FIG. 9A through FIG. 9E.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 1A through FIG. 1F illustrate a first embodiment of the present invention compact power semiconductor package 10 having a bonded stack of power inductor 12, bottom recessed leadframe 13 and power IC die 11 thus exhibiting a reduced package foot print. The bottom recessed leadframe 13 is made, for example by etching, with a bottom recess 14 that should be sized to accommodate the power IC die 11. FIG. 1A is a cross sectional side view of the power semiconductor package 10, FIG. 1B is its top view, FIG. 1C is a top view of an inductor core 15 (e.g., ferrite chip) that is a part of the power inductor 12, FIG. 1D is a top view of bottom half-coil patterned conductive leads 17a through 17g of the bottom recessed leadframe 13, FIG. 1E is a bottom view of the power semiconductor package 10, and FIG. 1F is a bottom view of bottom half-coil patterned conductive leads 17a through 17g mirroring FIG. 1D horizontally.

The power inductor 12 has a inductor core 15 located atop the bottom recessed leadframe 13. As shown in FIG. 1B and FIG. 1C, the inductor core 15 may have the form of a closed rectangle with an interior window 16. To those skilled in the art, to achieve high inductance with a compact inductor size, it is highly important to shape the inductor core 15 into a closed magnetic loop for confining most magnetic fluxes in it whereas the specific shape of this "closed loop" is of somewhat secondary importance. Thus, for example, the closed loop can alternatively be shaped into a square, a polygon, an ellipse or a toroid. Nevertheless, it is generally felt that the toroid shape should provide the most efficient magnetic flux confinement.

Next, the bottom recessed leadframe 13 has a first number of bottom half-coil patterned conductive leads 17a through 17g positioned beneath the inductor core 15. In essence, as illustrated in FIG. 1D, the bottom half-coil patterned conductive leads 17a through 17g form a bottom half-coil 18 of the power inductor 12. Correspondingly, a second number of top half-coil forming bond wires 19a through 19f are located atop the inductor core 15 with each bond wire looping the inductor core 15 from above. Furthermore, both ends of each top half-coil forming bond wire are connected to proper alternative bottom half-coil patterned conductive leads both within the interior window 16 of the inductor core 15 and about the inductor core 15, so as to jointly form an inductive coil enclosing the inductor core 15. Thus, for example, the ends of top half-coil forming bond wire 19a are respectively bonded to the bottom half-coil patterned conductive leads 17a and 17b. One end of top half-coil forming bond wire 19a is bonded to the end of the bottom half-coil patterned conductive lead 17b inside the interior window 16 of the inductor core 15 and the other end of top half-coil forming bond wire 19a is bonded to the end of the bottom half-coil patterned conductive lead 17a outside the inductor core 15. The ends of top half-coil forming bond wire 19b are respectively bonded to the bottom half-coil patterned conductive leads 17b and 17c. One end of top half-coil forming bond wire 19b is bonded to the end of the bottom half-coil patterned conductive lead 17c inside the interior window 16 of the inductor core 15 and the other end of top half-coil forming bond wire 19b is bonded to the end of the bottom half-coil patterned conductive lead 17b outside the inductor core 15. The ends of top half-coil forming bond wire 19c are respectively bonded to the bottom half-coil patterned conductive leads 17c and 17d, etc. Finally, the ends of top half-coil forming bond wire 19f are respectively bonded to the bottom half-coil patterned conductive leads 17f and 17g. As a result, the bottom half-coil patterned conductive leads 17a and 17g of the bottom recessed leadframe 13 also become the two device terminals of the power inductor 12 for circuit connection with other components of the power semiconductor package 10. For fine inductance adjustment of the power inductor 12, as illustrated in FIG. 1B and FIG. 1C, the inductor core 15 can be made with one or more air gap 15a along its magnetic loop—however, the inductor core 15 is still considered to have a closed magnetic loop. As a side remark, the various components 17a through 17g, 19a through 19f and 15 are illustrated with dashed component contours in FIG. 1B to signify that they are all hidden below the encapsulant 101.

In this embodiment, the power IC die 11 is configured with its substrate side 111 structured to bond to a bottom surface of the bottom recessed leadframe 13 and the device side 112 of the power IC die 11 facing away from the bottom recessed leadframe 13. Typically, the device side 112 has numerous contact bumps 11a through 11e formed on it for making external connections from the power IC die 11. In this application, the term bumps is understood to include solder balls, solder bumps, copper pillows, gold stud bumps, etc. For overall package protection, the power semiconductor package 10 has a top encapsulant 101 protectively encasing the power inductor 12 and a top portion of the bottom recessed leadframe 13.

FIG. 2 illustrates the side view of a second embodiment of the present invention power semiconductor package 20 using two laminated leadframes, a top leadframe 13a and a bottom leadframe 13b. As in the first embodiment, although not shown in this view, the top leadframe 13a includes numerous bottom half-coil patterned conductive leads 17a through 17g for forming an inductive coil with top half-coil forming bond wires 19c, 19d, etc. However, the bottom leadframe 13b is now made with an interior hole 13c of pre-determined geometry patterned in it. Thus, upon lamination of the bottom leadframe 13b to the bottom of the top leadframe 13a a properly sized bottom recess 14 is formed to accommodate the power IC die 11.

FIG. 3A and FIG. 3B illustrate the bottom views of a third embodiment of the present invention using partially sawn leadframes. In the power semiconductor package 30 of FIG. 3A, the bottom recess 14 with partial horizontal sawn edges 31a and 31b can be created by partially sawing the bottom side of a leadframe along a horizontal direction. However, in the power semiconductor package 35 of FIG. 3B, the bottom recess 14 with partial vertical sawn edges 36a and 36b can be created by partially sawing the bottom side of a leadframe along a vertical direction.

FIG. 4A through FIG. 4C illustrate a fourth embodiment of a power semiconductor package 40 using a number of peripheral standoff bumps 43b and 43c at the bottom of leadframe 41 and top half-coil forming interconnection plates 42a through 42h at its top. FIG. 4A is a top view with the encapsulant 101 removed for better visibility of the various internal components. FIG. 4B is the top view of numerous bottom half-coil patterned conductive leads 41a through 41j of leadframe 41. FIG. 4C is a side sectional view of the power semiconductor package 40 along direction A-A.

Instead of using top half-coil forming bond wires as in FIG. 1A, a number of three dimensionally formed top half-coil forming interconnection plates 42a through 42h, each looping the inductor core 15 from above and further connecting with proper alternative members of the bottom half-coil patterned conductive leads 41a through 41j, are employed to form the inductive coil. Thus, for example, the ends of top half-coil forming interconnection plate 42a are respectively bonded to the bottom half-coil patterned conductive leads 41a and 41b. The ends of top half-coil forming interconnection plate 42b are respectively bonded to the bottom half-coil patterned conductive leads 41b and 41c. The ends of top half-coil forming interconnection plate 42c are respectively bonded to the bottom half-coil patterned conductive lead 41c and 41d, etc. Finally, the ends of top half-coil forming interconnection plate 42h are respectively bonded to the bottom half-coil patterned conductive leads 41h and 41i. As a result, the bottom half-coil patterned conductive leads 41a and 41i also become the two device terminals of the power inductor 12 for circuit connection with other components of the power semiconductor package 40. Comparing with the bond wire, inductive coils formed with top half-coil forming interconnection plates enjoy the advantage of lower coil resistance.

Instead of using a bottom recessed leadframe 13 as in FIG. 1A, a number of peripheral standoff bumps 43b and 43c are attached to the bottom of bottom half-coil patterned conductive leads 41d and 41f to form a bottom recess sized to accommodate the power IC die 11 and for making external connections from the leadframe. The peripheral standoff bumps 43b and 43c may be relatively large compared to the contact bumps 11a and 11c on the power IC die 11. For stability, there are at least three peripheral standoff bumps, although only two are needed to form electrical connections with the inductor. Like FIG. 1A, the power IC die 11 is also configured with its substrate side 111 structured to bond to the bottom of bottom half-coil patterned conductive leads 41d and 41f and with the device side 112 of the power IC die 11 facing away from the leadframe.

FIG. 5 illustrates a fifth embodiment of a power semiconductor package 50 using an encapsulant 101 molding compound with embedded magnetic particles 53 to reduce magnetic field reluctance thus increasing the inductance value of the power inductor 12. Additionally, the bottom recessed leadframe 51 is formed with numerous geometric encapsulant locking features 52a and 52b that, upon mating with corresponding parts of the encapsulant 101, will strengthen anchoring and locking of the encapsulant 101 onto the power semiconductor package 50.

FIG. 6A through FIG. 6D illustrate a sixth embodiment of a power semiconductor package 60 that is similar to previous embodiments except for the replacement of the bottom recessed leadframe 13 with a two-layer multi-layer circuit laminate (MCL), such as a printed circuit board 61 bonding IC-contact pads 112a and 112b on the device side 112 of the power IC die 11. Accordingly, the substrate side 111 of the power IC die 11 can face away from the printed circuit board 61, and the device side 112 can face towards it. The two-layer printed circuit board 61 has a top conductive trace layer 62, a bottom conductive trace layer 64 and an intervening insulation layer 65 isolating the conductive trace layers 62 and 64 from each other. FIG. 6A is a side cross sectional view of the power semiconductor package 60. FIG. 6B is a top view of the top conductive trace layer 62. FIG. 6C is a bottom view of the printed circuit board 61 showing the bottom conductive trace layer 64. FIG. 6D is a top view of the power semiconductor package 60 with its encapsulant 101 removed for better visibility of the various internal components. Thus, the half-coil patterned conductive traces 62a through 62g of the top conductive trace layer 62 (corresponding to bottom conductive traces 64f and 64g) would be patterned and would serve a function similar to the bottom half-coil patterned conductive leads 17a through 17g of FIG. 1B.

Notice here that numerous device side IC-contact pads 112a and 112b of the power IC die 11 need to be separately bonded to their individual counterparts of the printed circuit board 61. As each of the bottom conductive trace layer 64 and the top conductive trace layer 62 of a printed circuit board 61 can be independently patterned with a large variety of conductive trace design geometries plus a number of interconnecting conductive through holes through the insulation layer 65, the bottom conductive trace layer 64 has been made, as illustrated, with numerous bottom conductive traces 64a through 64g plus conductive through holes 65a and 65b. The conductive through holes 65a and 65b allow connection from the inductor to the bottom side of the printed circuit board 61, where it can connect to the power-IC die 11 and to the outside. Thus, the position of the conductive through holes 65a and 65b on the bottom conductive trace layer 64 would match their counter parts on the top conductive trace layer 62. Likewise, the position of the bottom conductive traces 64d and 64b on the bottom conductive trace layer 64 would also match their counter part IC-contact pads 112a and 112b on the device side 112 of the power IC die 11. The positionally matched bottom conductive traces 64d, 64b and IC-contact pads 112a, 112b are then bonded together with reflown solder balls 113a and 113b thus making electrical connection between the power inductor 12 and the power IC die 11. As an optional feature, an encapsulating underfill 114 can be applied to further seal the interface between the bottom conductive trace layer 64 and the power IC die 11.

The printed circuit board 61 further includes, in contact with its bottom conductive traces 64a and 64e, a number of peripheral contact bumps 115e and 115a for forming a bottom recess 14 sized to accommodate the power IC die 11 and for making external connections from the printed circuit board 61. The bottom conductive trace layer 64 can include electrical routs to connect contact pads from the power IC die 11 to the periphery of the printed circuit board 61. In a more specific embodiment, the printed circuit board 61 can be made with a bismaleimide-triazine (BT) substrate.

FIG. 7A through FIG. 7C illustrate a seventh embodiment of a power semiconductor package 70 that is similar to the sixth embodiment except that the power IC die 11 is configured to have its substrate side 111 bonded to the bottom surface of the two-layer printed circuit board 61. Accordingly, the device side 112 of the power IC die 11 faces away from the printed circuit board 61. Any connection from the inductor to the power IC die 11 must be made externally from the power semiconductor package 70. FIG. 7A is a side cross sectional view of the power semiconductor package 70. FIG. 7B is a top view of the top conductive trace layer 62 while FIG. 7C is a bottom view of the bottom conductive trace layer 64. Notice the formation of numerous contact bumps 11b and 11c onto device side IC-contact pads 112b and 112c of the power IC die 11 for making electrical contacts external to the power semiconductor package 70. Bottom conductive terminal traces 64f and 64g plus peripheral contact bumps 115a and 115e similarly allow the inductor to make connections external to the power semiconductor package 70. Additional bottom bonding pads 64h through 64m are not connected to any other components, but allow for additional peripheral bumps (not shown) to be placed thereon for stability. Thus, the printed circuit board 61 is capable of packaging the power IC die 11 oriented with its substrate either up or down.

FIG. 8A through FIG. 8F illustrate an eighth embodiment of a power semiconductor package 150 that is similar to the sixth embodiment (FIG. 6A through FIG. 6D) except for the replacement of the two-layer printed circuit board 61 with a three-layer printed circuit board 211 bonding the device side 112 of the power IC die 11. Accordingly, the substrate side 111 of the power IC die 11 faces away from the printed circuit board 211. The three-layer printed circuit board 211 has top conductive trace layer 212, middle conductive trace layer 214 and bottom conductive trace layer 216 insulated from one another with an upper insulation layer 213 and a lower insulation layer 215.

FIG. 8A is a schematic side cross sectional view of the power semiconductor package 150. FIG. 8B is a top view of the top conductive trace layer 212. FIG. 8C is a top view of the upper insulation layer 213. FIG. 8D is a bottom view of the middle conductive trace layer 214. FIG. 8E is a bottom view of the bottom conductive trace layer 216. FIG. 8F is a bottom view of the power semiconductor package 150 without the power IC die 11 and encapsulating underfill 114 thus revealing part of the middle conductive trace layer 214. Thus, the half-coil patterned conductive traces 212a through 212g of the top conductive trace layer 212 would be patterned and would serve a function similar to the half-coil patterned conductive traces 62a through 62g of FIG. 7B. The conductive through holes 215a through 215h of the bottom conductive trace layer 216 would serve a function similar to the conductive through holes 65a and 65b of FIG. 7C, etc. Notably, conductive through holes 215g and 215h of the printed circuit board 211 can effect a direct connection between the power inductor 12 and the bottom of the power semiconductor package 150 for further contact to a system external to the power semiconductor package 150. Other conductive through holes 215a through 215f help provide connection from the bonding IC-contact pads 112a and 112b on the device side 112 of the power IC die 11 to the bottom of the power semiconductor package 150 for further contact to a system external to the power semiconductor package 150—the middle conductive traces 214a through 214g also form part of this electrical path. To those skilled in the art, the numerous conductive traces 214a through 214f and conductive through holes 215a through 215h of the remaining layers 213 and 214 can be positioned and/or patterned to realize a wide variety of interconnection topologies between the power inductor 12 and the power IC die 11. For example, the power IC die 11 and the power inductor 12 can be accommodated in the package without direct in-package interconnection between them, or they can be accommodated in the package with direct in-package interconnection means in between such as bond wires, interconnection plates or upper leadframe leads. By now it should also become clear that, within the spirit of the present invention, it is applicable to the packaging of a bottom power IC die, a top power inductor and an intervening circuit substrate that can be made of a leadframe or a multi-layer circuit laminate (MCL).

As an application example of the present invention, a power inductor with the following inductance rating has been achieved:

An inductance ranges from about 0.2 micro Henry to about 10 micro Henry with a current rating ranging from about 0.2 Ampere to about 5 Ampere.

Furthermore, the corresponding power semiconductor package foot print measures less than about 5 mm×5 mm with package thickness less than about 2 mm.

FIG. 9A through FIG. 9E illustrate a first process for making multiple units of the compact power semiconductor package 10 of FIG. 1A. In FIG. 9A a set of linearly arranged multiple leadframe units 13 are provided on a single body for easy handling in a volume manufacturing environment. The leadframe units are illustrated with two representative leadframe unit-N 80a and leadframe unit-N+1 80b joined by a future dicing streak-N 81a. Each leadframe unit has been made with:

A set of bottom half-coil patterned conductive leads and a bottom recess 14. As a remark, the bottom recess 14 can be made with mechanical milling/sawing or a patterned etching process.

A inductor core 15 attached to the set of bottom half-coil patterned conductive leads.

A set of top half-coil forming bond wires, looping the inductor core 15 as illustrated by representative top half-coil forming bond wire 19c and top half-coil forming bond wire 19d, wire bonded to the set of bottom half-coil patterned conductive leads thus formed the power inductor 12.

In FIG. 9B a top encapsulant 101 is applied atop the package in progress so as to protectively encase the top of each sub-package unit. This can be done with a liquid phase casting or coating process followed by encapsulant curing.

In FIG. 9C the package in progress is flipped upside down and extra unwanted encapsulant in the bottom recess 14 region is removed. While not specifically illustrated here, extra unwanted encapsulant in the bottom recess 14 region can be either removed with controlled post-etching or prevented in advance with an encapsulant-blocking tool inserted into the bottom recess 14 region prior to top encapsulant application.

In FIG. 9D multiple power IC dies 11, each with its own pre-attached contact bumps 11a through 11c, are aligned and bonded to the bottom recessed leadframes 13 of the package in progress with a chip bonding process.

In FIG. 9E individual power semiconductor package units, illustrated by power semiconductor package unit-N 83a and power semiconductor package unit-N+1 83b, are separated. As an example, the separation can be effected with a dicing saw resulting in a dicing streak-N 82*a* between power semiconductor package unit-N 83*a* and power semiconductor package unit-N+1 83*b*, etc.

FIG. 10A through FIG. 10C illustrate a second process for making multiple units of the power semiconductor package 20 of FIG. 2. The process leading up to FIG. 10A is the same as the process leading up to FIG. 9C except:

1. Each top leadframe unit (84*a*, 84*b*, etc.) has been made with a top leadframe 13*a* that has no bottom recess 14 and that is thinner than the bottom recessed leadframe 13 of FIG. 1A.
2. A second set of multiple bottom leadframe units (85*a*, 85*b*, etc.), each with a bottom leadframe 13*b* and a patterned interior hole 13*c* of pre-determined geometry matching the top leadframe 13*a*, are provided on the bottom of the top leadframe 13*a*.

Thus, upon laminating the multiple bottom leadframe units (85*a*, 85*b*, etc.) onto the multiple top leadframe units (84*a*, 84*b*, etc.) the bottom recesses 14 can also be formed and this is illustrated in FIG. 10B. Afterwards, the process steps leading up to FIG. 10C are the same as those leading up to FIG. 9E. The net difference between FIG. 9E and FIG. 10C is that the bottom recessed leadframe 13 of FIG. 9E is now replaced by a laminate of top leadframe 13*a* and bottom leadframe 13*b* of FIG. 10C.

FIG. 11A through FIG. 11C illustrate a third process for making multiple units of the compact power semiconductor package 35 of FIG. 3B wherein the bottom recess 14 is bordered by two partial vertical sawn edges 36*a* and 36*b*. Thus, the process leading up to FIG. 11A is the same as the process leading up to FIG. 9C except for the absence of the bottom recess 14 from the leadframe. In FIG. 11B, a number of bottom recesses 14 are created by partially sawing the leadframe units (90*a*, 90*b*, etc.) in the bottom side of the leadframe units and in a direction perpendicular to the leadframe set (normal to the drawing paper) resulting in partial sawn areas (91*a*, 91*b*, etc.). Finally, in FIG. 11C individual power semiconductor package units, illustrated by power semiconductor package unit-N 87*a* and power semiconductor package unit-N+1 87*b*, are separated. As an example, the separation can be effected with a dicing saw resulting in a dicing streak-N 82*a* between power semiconductor package unit-N 87*a* and power semiconductor package unit-N+1 87*b*, etc. Of course, these same principles can be applied to an array of power semiconductor package units rather than just a linear arrangement.

FIG. 12A through FIG. 12F illustrate the making of another power semiconductor package 250 with a variation of the first process described in FIG. 9A through FIG. 9E. To avoid excessive obscuring of details, focus is here directed to making one power semiconductor package with extension to multiple leadframe units already made clear by now to those skilled in the art with the numerous aforementioned processes.

Thus, FIG. 12A illustrates a leadframe made with leadframe portions 51*a*, 51*b*, 51*c* forming a bottom recess 14 and having encapsulant locking features 52*a* and 52*b*. However, as part of the leadframe, an interim joining area 51*d* has been added connecting the bottom half-coil patterned conductive leads (such as bottom half-coil patterned conductive leads 17*a* through 17*g* of FIG. 1B) and leadframe portions 51*a*, 51*b*, 51*c* together to facilitate subsequent handling of the package in progress. FIG. 12B illustrates the result of attaching a inductor core 15 atop the leadframe. FIG. 12C illustrates the looping and attachment of top half-coil forming bond wires 19*c* and 19*d* to the bottom half-coil patterned conductive leads. FIG. 12D illustrates the application of top encapsulant 101 onto the package in progress with strengthened anchoring owing to the encapsulant locking features 52*a* and 52*b*. Here, one should insure that the top encapsulant 101 is electrically non-conductive and bonds together with the bottom half-coil patterned conductive leads and the leadframe portions 51*a*, 51*b*, 51*c*. FIG. 12E illustrates the result of removing the interim joining area 51*d* from the leadframe so as to clear an otherwise unacceptable short-circuit condition among the bottom half-coil patterned conductive leads and the leadframe portions 51*a*, 51*b* and 51*c*. This can be accomplished with, for example, localized machining or patterned chemical etching. As the top encapsulant 101 is electrically non-conductive and bonds together with the bottom half-coil patterned conductive leads and the leadframe portions 51*a*, 51*b*, 51*c* thus holding them in place, the interim joining area 51*d* is no longer required. Finally, FIG. 12F illustrates the completed power semiconductor package 250 following die attachment, within the bottom recess 14, of a power IC die 11 with pre-formed contact bumps 11*a* and 11*c*.

By now it should become clear to those skilled in the art that the numerous embodiments just described can be readily modified to suit other specific applications as well. While the description above contains many specificities, these specificities should not be constructed as accordingly limiting the scope of the present invention but as merely providing illustrations of numerous presently preferred embodiments of this invention.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed are:

1. A compact power semiconductor package comprising:
    a bonded stack of a bottom power Integrated Circuit (IC) die, a top power inductor and an intervening circuit substrate;
    said power inductor further comprises a inductor core with an interior window, in the form of a closed magnetic loop, located atop the circuit substrate;
    said circuit substrate further comprises a bottom half-coil forming means constituting a bottom half-coil beneath the inductor core; and
    a top half-coil forming means located atop the inductor core and interconnected with the bottom half-coil forming means so as to jointly form an inductive coil enclosing the inductor core
    whereby realizing a compact power semiconductor package with high inductance rating while exhibiting a reduced package foot print.

2. The power semiconductor package of claim 1 wherein ones of the top half-coil forming means couple the ends of ones of the bottom half-coil forming means exposed through the interior window of the inductor core to the ends of adjacent ones of the bottom half-coil forming means outside the inductor core to form the inductive coil.

3. The power semiconductor package of claim 1 wherein the power IC die is configured with its substrate side structured to bond to a bottom surface of the circuit substrate and the device side of the power IC die facing away from the circuit substrate.

4. The power semiconductor package of claim 3 wherein the device side of said power IC die further comprises a plurality of bottom contact bumps formed thereon for making external connections from the power IC die.

5. The power semiconductor package of claim 1 further comprises a top encapsulant protectively encasing the inductor core, the top half-coil forming means, the bottom half-coil forming means and the circuit substrate.

6. The power semiconductor package of claim 5 wherein the top encapsulant further comprises a molding compound with embedded magnetic particles to increase the inductance rating.

7. The power semiconductor package of claim 1 wherein:
said circuit substrate further comprises a leadframe and said bottom half-coil forming means further comprises a plurality of half-coil patterned conductive leads that are part of the leadframe; and
said leadframe further comprises a bottom recess sized to accommodate the power IC die.

8. The power semiconductor package of claim 1 wherein said circuit substrate further comprises:
a top leadframe and said bottom half-coil forming means further comprises a plurality of half-coil patterned conductive leads that are part of the top leadframe; and
a bottom leadframe matching the top leadframe with an interior hole of pre-determined geometry patterned therein and said bottom leadframe being further laminated to the bottom of the top leadframe so as to form a bottom recess sized to accommodate the power IC die.

9. The power semiconductor package of claim 1 wherein said top half-coil forming means further comprises a plurality of bond wires each looping the inductor core from above and further connecting with proper alternative members of the bottom half-coil forming means whereby forming the inductive coil.

10. The power semiconductor package of claim 1 wherein said top half-coil forming means further comprises a plurality of three dimensionally formed interconnection plates each connecting with proper alternative members of the bottom half-coil forming means whereby forming the inductive coil.

11. The power semiconductor package of claim 1 wherein said top half-coil forming means further comprises a plurality of upper leadframe leads, each connecting with proper alternative members of the bottom half-coil forming means whereby forming the inductive coil.

12. The power semiconductor package of claim 1 wherein said circuit substrate comprises a multi-layer circuit laminate (MCL) further comprising:
a top conductive trace layer having a plurality of half-coil patterned conductive traces constituting the bottom half-coil forming means and a plurality of top conductive traces;
a bottom conductive trace layer having a plurality of bottom conductive traces; and
an intervening insulation layer for isolating the top conductive trace layer from the bottom conductive trace layer.

13. The power semiconductor package of claim 12 wherein:
said intervening insulation layer further comprises a plurality of conductive through holes for electrically connecting a first number of selected half-coil patterned conductive traces with a second number of selected bottom conductive traces whereby making electrical connection between the power IC die and the power inductor.

14. The power semiconductor package of claim 12 wherein the power IC die is configured with its device side structured to bond to a bottom surface of the MCL and the substrate side of the power IC die facing away from the MCL, wherein contacts on the device side of the power IC die are routed out to the periphery of the MCL.

15. The power semiconductor package of claim 12 wherein said MCL further comprises a bottom recess sized to accommodate the power IC die.

16. The power semiconductor package of claim 12 wherein said MCL is a printed circuit board.

17. The power semiconductor package of claim 12 wherein said MCL is a bismaleimide-triazine (BT) substrate.

18. The power semiconductor package of claim 12 wherein said MCL has three conductive trace layers, separated by two insulating layers.

19. The power semiconductor package of claim 1 wherein:
the power inductor has an inductance ranging from about 0.2 micro Henry to about 10 micro Henry with a current rating ranging from about 0.2 Ampere to about 5 Ampere; and
the corresponding package foot print is less than about 5 mm×5 mm with package thickness less than about 2 mm.

20. The power semiconductor package of claim 1 further comprising:
a plurality of peripheral standoff bumps on the bottom surface of the circuit substrate with the peripheral standoff bumps further sized to accommodate the power IC die.

21. A multi-package process for making multiple compact power semiconductor package units each comprising:
a stack of bottom power IC die, top power inductor and an intervening circuit substrate; the power inductor comprises a inductor core, with an interior window, of closed magnetic loop located atop the circuit substrate; the circuit substrate comprises a bottom half-coil forming means beneath the inductor core; and a top half-coil forming means interconnected with the bottom half-coil forming means jointly forming an inductive coil enclosing the inductor core;
the method comprises:
a) providing a set of multiple circuit substrates with each circuit substrate having the bottom half-coil forming means thereon;
b) providing then structuring multiple power IC dies so that each power IC die is ready for a chip bonding process;
c) providing multiple inductor cores with interior windows and multiple top half-coil forming means;
d) attaching a inductor core to each bottom half-coil forming means;
e) at each circuit substrate location along the set,
e1) aligning a top half-coil forming means atop the inductor core and interconnecting the top half-coil forming means with the bottom half-coil forming means to form a sub-package unit with an inductive coil about the inductor core;
e2) applying a top encapsulant protectively encasing the top of each sub-package unit; and
e3) aligning and bonding a power IC die beneath the sub-package unit to form a package unit; and
f) separating the package unit from the set.

22. The multi-package process of claim 21 wherein ones of the top half-coil forming means couple the ends of ones of the bottom half-coil forming means exposed through the interior window of the inductor core to the ends of adjacent ones of the bottom half-coil forming means outside the inductor core to form the inductive coil.

23. The multi-package process of claim 21 wherein each circuit substrate is made of a leadframe with the bottom half-coil forming means further including a plurality of half-coil patterned conductive leads being part of the leadframe and:

step a) further comprises, as part of the leadframe, adding an interim joining area connecting the half-coil patterned conductive leads together to facilitate subsequent handling of each sub-package unit; and step e2) further comprises:

e21) insuring that the top encapsulant is electrically non-conductive and bonds together the half-coil patterned conductive leads; then e22) removing the interim joining area from the leadframe so as to clear an otherwise short-circuit condition amongst the half-coil patterned conductive leads.

24. The multi-package process of claim 21 wherein patterning the set of multiple circuit substrates further comprises creating, on each circuit substrate, a bottom recess sized to accommodate the power IC die.

25. The multi-package process of claim 24 wherein creating a bottom recess further comprises etching the bottom side of said each circuit substrate.

26. The multi-package process of claim 24 wherein creating a bottom recess further comprises partially sawing the bottom side of said each circuit substrate.

27. The multi-package process of claim 24 wherein the circuit substrate is made of leadframe and creating a bottom recess further comprises:

providing a top leadframe with a plurality of half-coil patterned conductive traces forming the bottom half-coil forming means; and providing a bottom leadframe with an interior hole of predetermined geometry patterned therein and further laminating the bottom leadframe to the bottom of the top leadframe so as to form the bottom recess.

28. The multi-package process of claim 21 further comprises attaching a plurality of peripheral bumps onto the bottom of each circuit substrate.

\* \* \* \* \*